United States Patent
Bhattacharjee et al.

(10) Patent No.: US 11,984,863 B2
(45) Date of Patent: May 14, 2024

(54) SENSOR WITH RESONATOR SUPPORTED ON A SUBSTRATE

(71) Applicant: Kampanics, L.L.C., Kernersville, NC (US)

(72) Inventors: Kushal Kumar Bhattacharjee, Kernersville, NC (US); Mihir S. Patel, Hopkinton, MA (US)

(73) Assignee: Kampanics, L.L.C., Kernersville, NC (US)

( * ) Notice: Subject to any disclaimer, the term of this patent is extended or adjusted under 35 U.S.C. 154(b) by 415 days.

(21) Appl. No.: 17/368,033

(22) Filed: Jul. 6, 2021

(65) Prior Publication Data

US 2022/0014162 A1 Jan. 13, 2022

Related U.S. Application Data

(60) Provisional application No. 63/049,422, filed on Jul. 8, 2020.

(51) Int. Cl.
*H03H 3/02* (2006.01)
*H03H 9/02* (2006.01)

(52) U.S. Cl.
CPC .......... *H03H 3/02* (2013.01); *H03H 9/02039* (2013.01); *H03H 2003/028* (2013.01)

(58) Field of Classification Search
CPC ............ H03H 3/00; H03H 3/02; H03H 3/021; H03H 3/022; H03H 3/023; H03H 3/024; H03H 3/025; H03H 3/026; H03H 3/027; H03H 9/00; H03H 9/02; H03H 9/0239
USPC ......................................................... 333/178
See application file for complete search history.

(56) References Cited

U.S. PATENT DOCUMENTS

| | | | |
|---|---|---|---|
| 8,063,720 B2 * | 11/2011 | Ayazi | H03H 9/2405 333/186 |
| 9,038,263 B2 | 5/2015 | Puccio et al. | |
| 9,369,105 B1 | 6/2016 | Li et al. | |
| 9,762,204 B2 | 9/2017 | Aastrup et al. | |
| 10,048,146 B2 | 8/2018 | Puccio et al. | |
| 10,184,845 B2 | 1/2019 | Tadigadapa et al. | |
| 10,326,425 B2 | 6/2019 | Belsick et al. | |
| 10,355,664 B2 | 7/2019 | Patel et al. | |
| 10,673,408 B2 | 6/2020 | Goto et al. | |

(Continued)

FOREIGN PATENT DOCUMENTS

CN 109962689 A 7/2019

OTHER PUBLICATIONS

Sizhe, L, et al., "High frequency acoustic on-chip integration for particle characterization and manipulation in microfluidics", Applied Physics Letters 111, Oct. 17, 2017, pp. 1-5, 163503.

(Continued)

*Primary Examiner* — Hai L Nguyen
(74) *Attorney, Agent, or Firm* — COATS & BENNETT, PLLC

(57) ABSTRACT

A sensor that includes a substrate with a first side having a cavity extending into the first side. A resonator is connected to the substrate and extends over the cavity with the resonator including first and second electrodes overlapping on opposing sides of the piezoelectric crystal. The substrate is connected to the resonator such that one or more physical parameters exerted on the substrate are transferred to the resonator.

20 Claims, 24 Drawing Sheets

(56) References Cited

U.S. PATENT DOCUMENTS

| | | | |
|---|---|---|---|
| 2002/0093394 | A1 | 7/2002 | Tikka et al. |
| 2006/0125489 | A1 | 6/2006 | Feucht et al. |
| 2007/0115078 | A1 | 5/2007 | Sano et al. |
| 2010/0242615 | A1 | 9/2010 | Sato et al. |
| 2011/0050366 | A1 | 3/2011 | Ayazi et al. |
| 2011/0050809 | A1 | 3/2011 | Takahashi |
| 2011/0115337 | A1 | 5/2011 | Nakamura et al. |
| 2011/0304412 | A1 | 12/2011 | Zhang |
| 2013/0059396 | A1 | 3/2013 | LeBoeuf et al. |
| 2014/0008307 | A1 | 1/2014 | Guldiken et al. |
| 2015/0321129 | A1 | 11/2015 | Lipkens et al. |
| 2015/0349747 | A1 | 12/2015 | Burak et al. |
| 2016/0184790 | A1 | 6/2016 | Sinha et al. |
| 2017/0052174 | A1 | 2/2017 | Branch et al. |
| 2017/0149408 | A1 | 5/2017 | Belsick et al. |
| 2017/0170383 | A1 | 6/2017 | Sammoura et al. |
| 2017/0229638 | A1 | 8/2017 | Gamo et al. |
| 2018/0076377 | A1 | 3/2018 | Park et al. |
| 2020/0276579 | A1 | 9/2020 | Huang et al. |

OTHER PUBLICATIONS

Torunbalci, M., et al., "Acceleration Insensitive Hemispherical Shell Resonators Using Pop-Up Rings", IEEE, MEMS 2018, Jan. 21-25, 2018, pp. 956-959, Belfast, Northern Ireland, UK.

Ansorge, E., et al., "Design and Fabrication of High-Q Langasite Resonator Arrays for High Temperature Applications", IEEE, Jan. 1, 2008, pp. 619-624.

Patel, M., et al., "Stress-and Temperature-Compensated Orientations for Thickness-Shear Langasite Resonators for High-Temperature and High-Pressure Environment", IEEE Transactions on Ultrasonics, Ferroelectrics, and Frequency Control, Jun. 1, 2015, pp. 1095-1103, vol. 62, No. 6.

Sinha, B., "Doubly Rotated Contoured Quartz Resonators", IEEE Transactions on Ultrasoncis, Ferroelectrics, and Frequency Control, Sep. 1, 2001, pp. 1162-1180, vol. 48, No. 5.

Besson, R.J., et al., "A Dual-Mode Thickness-Shear Quartz Pressure Sensor", IEEE Transactions on Ultrasonics, Ferroelectrics, and Frequency Control, Sep. 1, 1993, pp. 584-591, vol. 40, No. 5.

Richter, D., et al., "Miniaturized Resonant Gas Sensors for High-Temperature Applications", IEEE Sensors 2008 Conference, Jan. 1, 2008, pp. 1536-1539.

Patel, M., et al., "A Dual-Mode Thickness-Shear Quartz Pressure Sensor for High Pressure Applications", IEEE Sensors Journal, Jun. 15, 2016, pp. 4893-4901, vol. 18, No. 12.

Eernisse, E., et al., "Review of Thickness-Shear Mode Quartz Resonator Sensors for Temperature and Pressure", IEEE Sensors Journal, Jun. 1, 2001, pp. 79-87, vol. 1, No. 1.

APC International, Ltd., "Piezo Electrode Patterns", Jan. 1, 2021, pp. 1-6.

\* cited by examiner

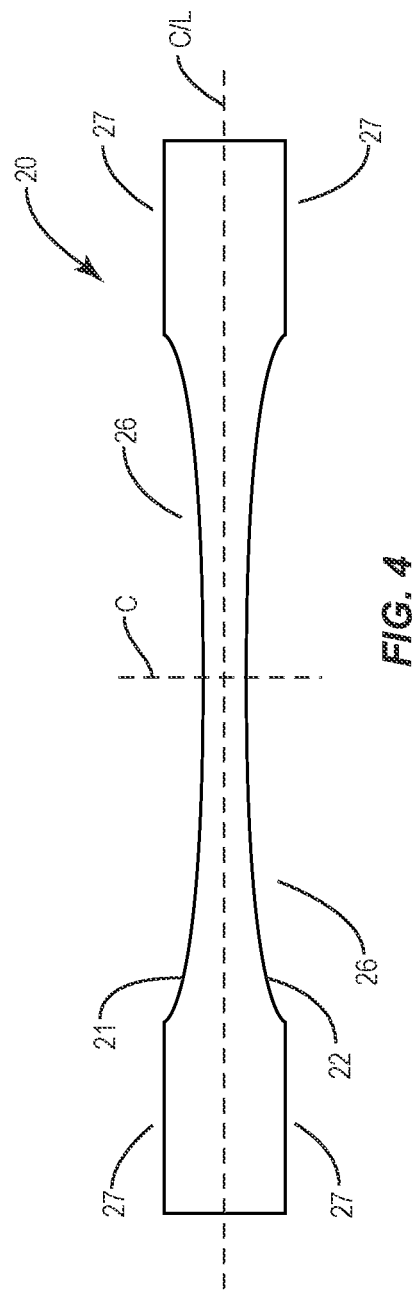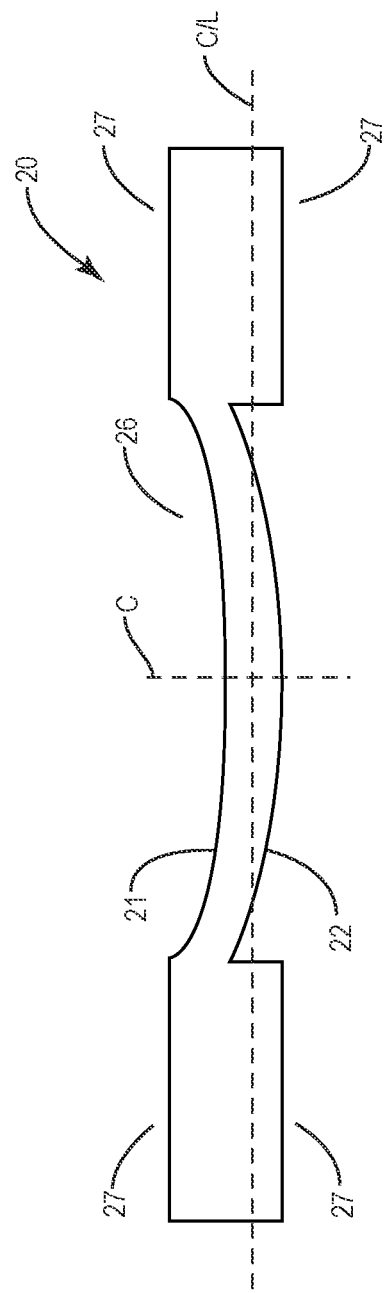

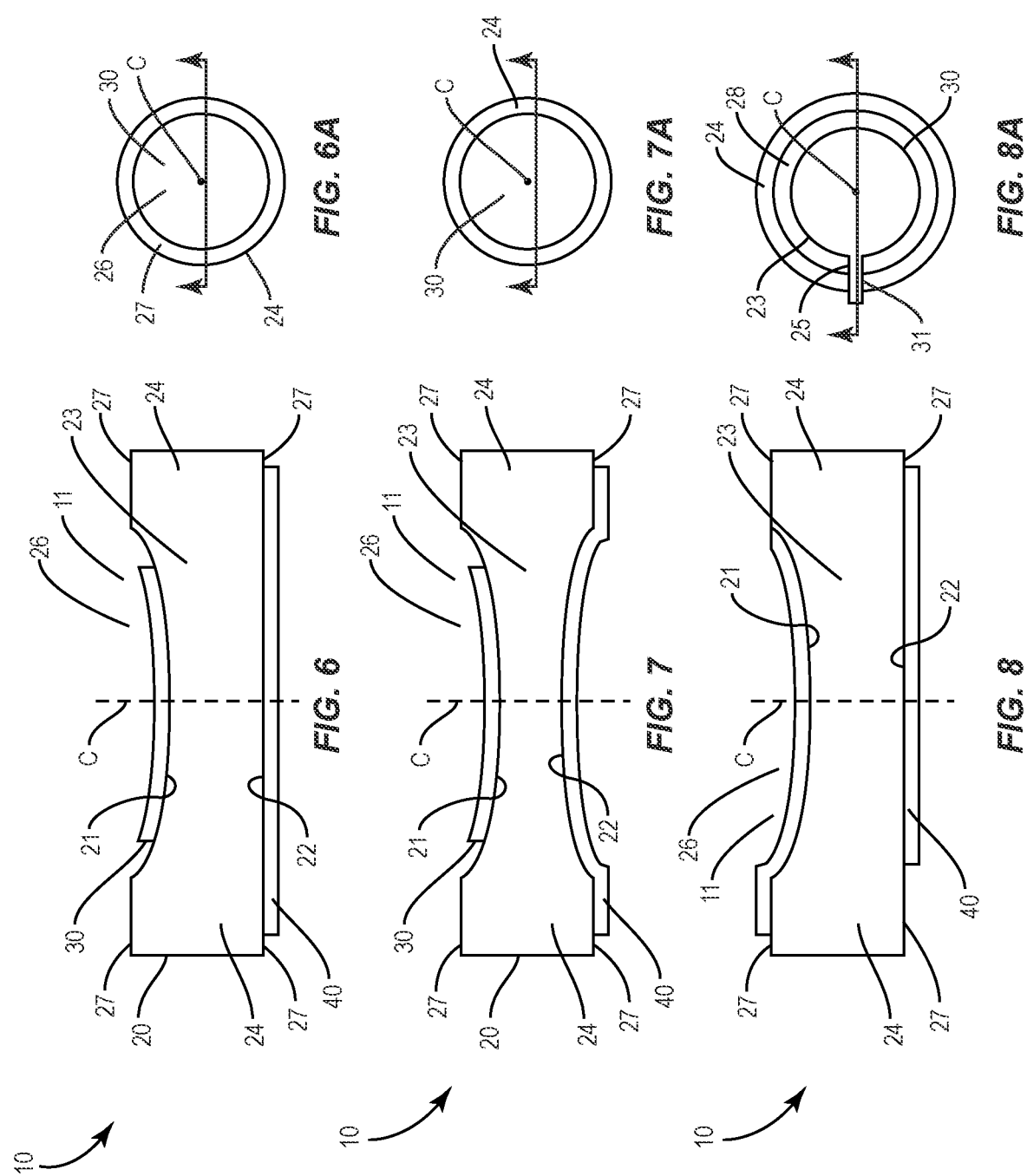

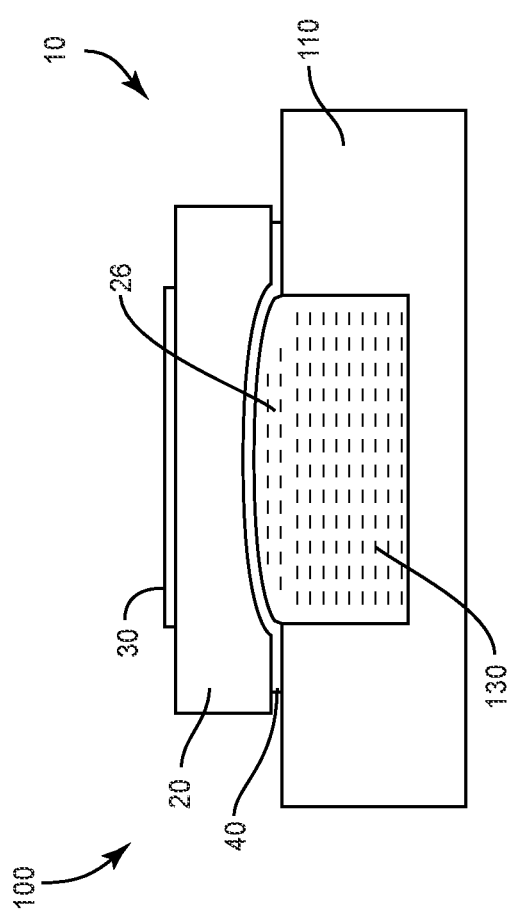
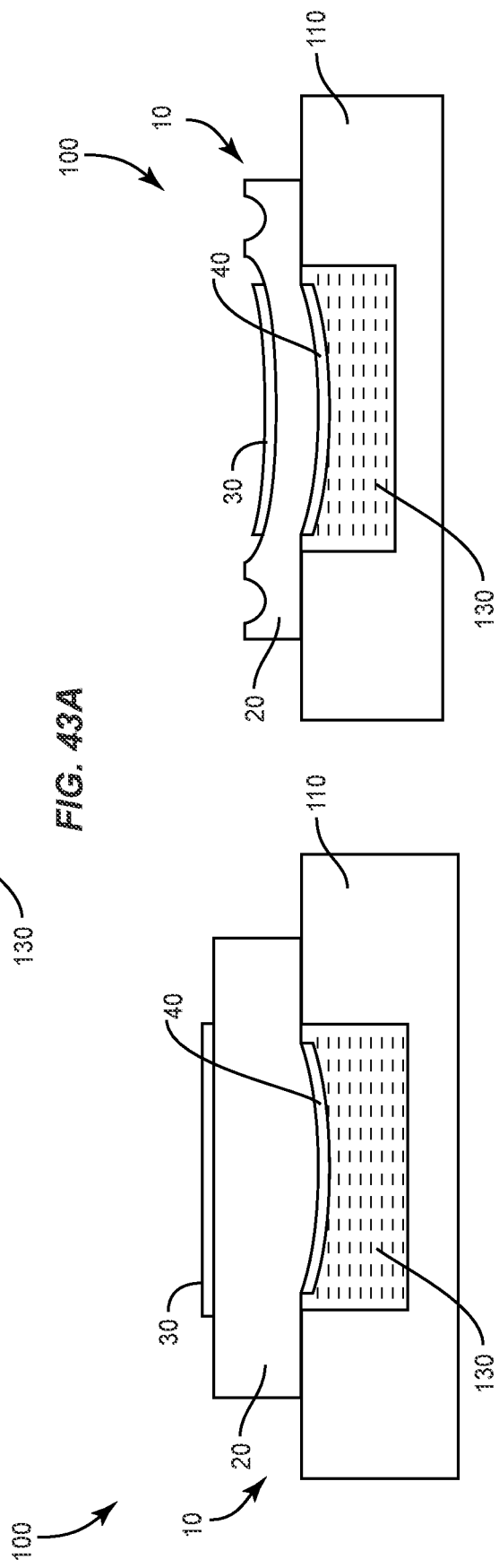

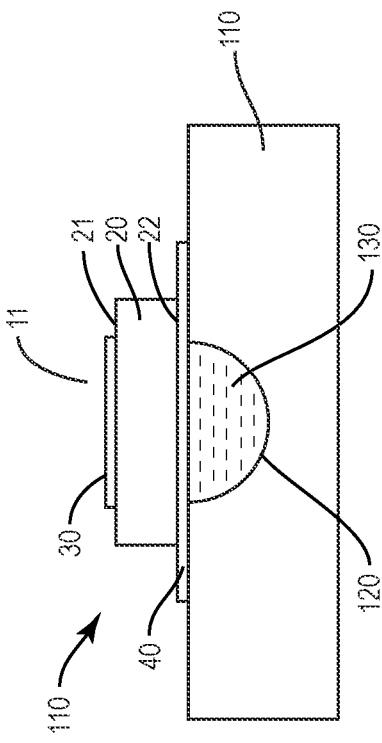
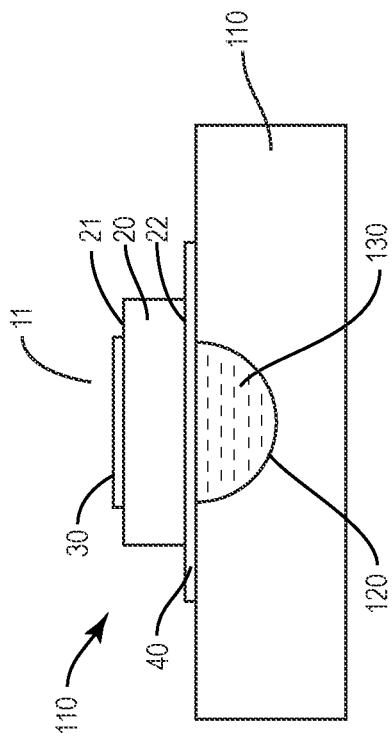
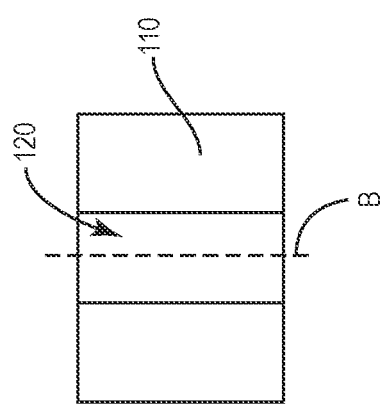
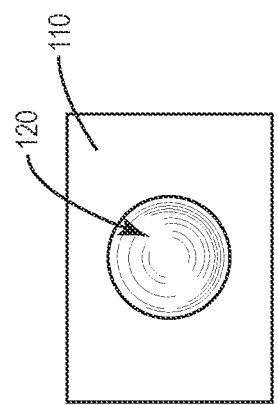

SENSOR WITH RESONATOR SUPPORTED ON A SUBSTRATE

RELATED APPLICATIONS

The present application claims the benefit of earlier-filed U.S. application 63/049,422 filed on Jul. 8, 2020, and which is hereby incorporated by reference in its entirety.

BACKGROUND

Piezoelectric resonators based on single crystal have been the heart of various sensors, filters, and oscillators for several decades. Single crystalline nature of the piezoelectric material has intrinsic low material loss which leads to high Q-factor for different resonator-based applications for frequency control and sensing devices. One acoustic mode for resonators is the Thickness Shear Mode (TSM). In prior art designs, these TSM based resonators are single mode device, i.e., their operational principle is on the excitation of slow thickness-shear mode. The disadvantage of this principle is that external circuit components/advanced signal processing techniques are required to compensate the environmental effects for stable operation which leads to a time delay in the response. Further, in some prior art designs, the planar surfaces of the piezoelectric crystal result in energy leakage from an active section of the resonator to the surrounding inactive substrate area. This leakage can occur even when using tethers to support the active section by the surrounding substrate. Further, these designs can have increased spurious modes.

FIG. 1 illustrates a conventional resonator of circular symmetry 10 that includes a piezoelectric crystal 20 with first and second surfaces 21, 22. Electrodes 30, 40 are positioned on the first and second surfaces 21, 22. The piezoelectric crystal 20 includes a single crystalline nature that provides versatility of launching different acoustic modes depending on particular orientations of the crystal chosen for excitation or detection. One acoustic mode is the Thickness Shear Mode (TSM). The thickness shear mode is excited when an electric field is applied in the direction of thickness to a piezoelectric crystal 20 giving a shear deformation (dashed line) to the piezoelectric crystal 20 with particle displacements in the medium shown by the arrows.

An active region 11 is formed in an area in which the electrodes 30, 40 overlap. The active region 11 is surrounded by an inactive region 12. Due to this surrounding contact, the shear response of the piezoelectric crystal 20 in the active region 11 is damped by the piezoelectric crystal 20 in the inactive region 12 due to leakage of energy, thereby limiting shear displacement and potentially limiting detection sensitivity and performance of the resonator device 10. Structures and methods are needed to prevent energy leakage of the resonator.

SUMMARY

One aspect is directed to a sensor, comprising a substrate comprising a first side with a cavity extending into the first side. A resonator is connected to the substrate and extends over the cavity with the resonator comprising first and second electrodes overlapping on opposing sides of the piezoelectric crystal. The substrate is connected to the resonator such that one or more physical parameters exerted on the substrate are transferred to the resonator.

In another aspect, a post extends outward from a bottom edge of the cavity and extends across the cavity and contacts against the resonator to support the resonator over the cavity.

In another aspect, the resonator is connected to the substrate only through the post and the resonator comprises a floating configuration that is spaced away from the substrate and configured to sense shear stress.

In another aspect, the resonator is a dual thickness shear mode resonator.

In another aspect, the cavity is a first cavity and further comprising a cap that extends over the resonator on an opposing side from the substrate with the cap being spaced away from the resonator with the first side of the substrate and the cap extending around and forming a second cavity with the resonator positioned in the second cavity.

In another aspect, a cap extends over the resonator on an opposing side of the substrate and is mounted to the substrate with the cap being spaced away from the resonator, and a cap post that extends outward from the cap and contacts against the resonator such that the one or more physical parameters exerted on the cap are transferred to the resonator.

In another aspect, a control unit is operatively connected to the resonator with the control unit configured to sense the one or more physical parameters that are applied to the substrate.

In another aspect, the resonator is a dual thickness shear mode resonator, an isolation region extends around the resonator and separates the resonator from an inactive region; and one or more tethers extend across the isolation region and connect the resonator to the inactive region.

In another aspect, the inactive region comprises one or more of the second electrode and the piezoelectric crystal.

One aspect is directed to a sensor comprising a substrate comprising a face with a cavity that extends into the face and with the face comprising peripheral regions that extend around the cavity. A resonator is positioned over the cavity and comprising first and second electrodes overlapping on opposing sides of a piezoelectric crystal. The second electrode and the piezoelectric crystal are positioned over the peripheral regions and separated from the resonator by one or more isolation regions. One or more posts extend across the cavity and support the resonator over the cavity and away from the substrate.

In another aspect, the piezoelectric crystal extends across the resonator, across the one or more isolation regions, and into the peripheral regions, with the one or more supports comprising one or more tethers formed by the piezoelectric crystal.

In another aspect, the second electrode extends across the resonator, across the one or more isolation regions, and into the peripheral regions, with the one or more supports comprising one or more tethers formed by the second electrode.

In another aspect, the one or more tethers are formed by the piezoelectric crystal.

In another aspect, the one or more isolation regions comprise one or more annular notches in the piezoelectric crystal.

In another aspect, the resonator is a dual thickness shear mode resonator.

In another aspect, a cap extends over the resonator on an opposing side from the substrate and is mounted at the peripheral region with the cap being spaced away from the resonator, and a cap post extends outward from the cap and contacts against the resonator.

In another aspect, a control unit is operatively connected to the resonator with the control unit configured to sense one or more physical parameters that are applied to one or more of the substrate and the cap.

In another aspect, the resonator comprises a contoured section with the piezoelectric crystal and the first electrode comprising a contoured shape.

In another aspect, the one or more supports comprise a post that extends outward from a bottom edge of the cavity and extends across the cavity and contacts against the resonator to support the resonator over the cavity.

One aspect is directed to a method of sensing one or more physical parameters. The method comprises locating a sensor in an environment with the sensor comprising: a substrate comprising a first side with a cavity that extends into the first side; a resonator mounted to the substrate and positioned over the cavity with the resonator comprising first and second electrodes overlapping on opposing sides of the piezoelectric crystal; and a cap mounted over the resonator. The method comprises transferring forces of the one or more physical parameters that are applied to one or both of the substrate and the cap. The method comprises determining effects of the one or more physical parameters exerted on one or both of the substrate and the cap.

The various aspects of the various embodiments may be used alone or in any combination, as is desired.

BRIEF DESCRIPTION OF THE DRAWINGS

FIG. 4 is a schematic cross section view of only the piezoelectric layer of a concave-concave resonator.

FIG. 5 is a schematic cross section view of only the piezoelectric layer of a concave-convex resonator.

FIG. 6A is a top view of a plano-concave resonator.

FIG. 6 is a schematic cross section view of the plano-concave resonator of FIG. 6A.

FIG. 7A is a top view of a concave-concave resonator.

FIG. 7 is a schematic cross section view of the concave-concave resonator of FIG. 7A.

FIG. 8A is a top view of a plano-concave resonator where the active area is suspended by tethers.

FIG. 8 is a schematic cross section view of the plano-concave resonator of FIG. 8A.

FIGS. 43A, 43B, and 43C are schematic cross section views of acoustic wave devices with contoured resonators for use with microfluidics applications.

FIG. 47A is a top view of a cavity in a substrate.

FIG. 47B is a schematic cross section view of an acoustic wave device mounted on the substrate of FIG. 47A.

FIG. 48A is a top view of a cavity in a substrate.

FIG. 48B is a schematic cross section view of an acoustic wave device mounted on the substrate of FIG. 48B.

DETAILED DESCRIPTION

Figure 1:
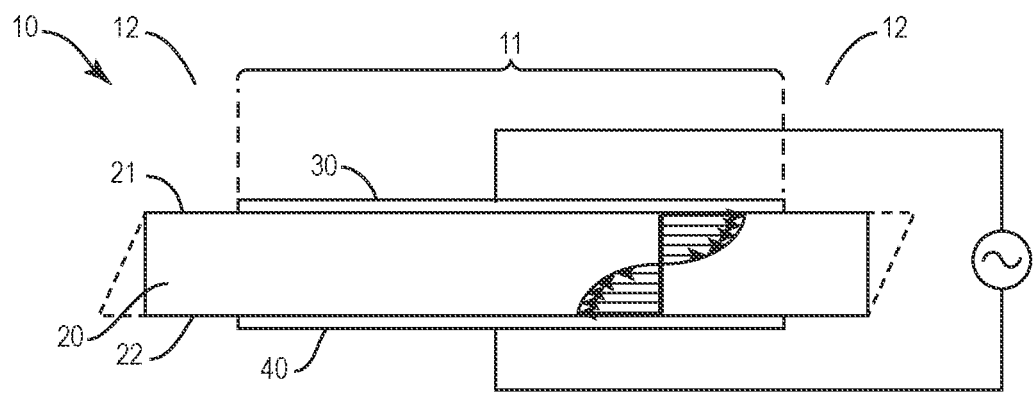
FIG. 1 is a schematic cross section view of a planar thickness shear mode resonator.
Figure 2:
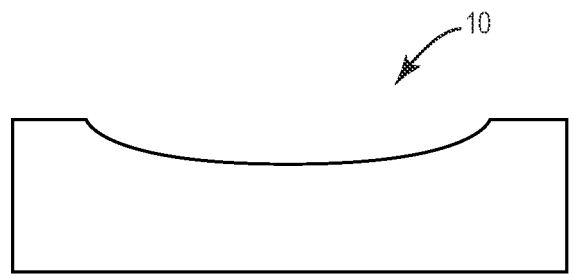
FIG. 2 is a schematic drawing of a contoured resonator.

The present application discloses various dual thickness shear mode resonators. The resonators include a contoured shape. FIG. 2 schematically illustrates a resonator 10 that includes a contoured shape. The contoured shape reduces energy leakage and/or confines the acoustic energy produced by the resonator 10. FIG. 2 illustrates an example with a single surface having a contoured shape. Other examples include more than one surface having a contoured shape. The resonator 10 is mounted to a substrate 100.

Figure 3:
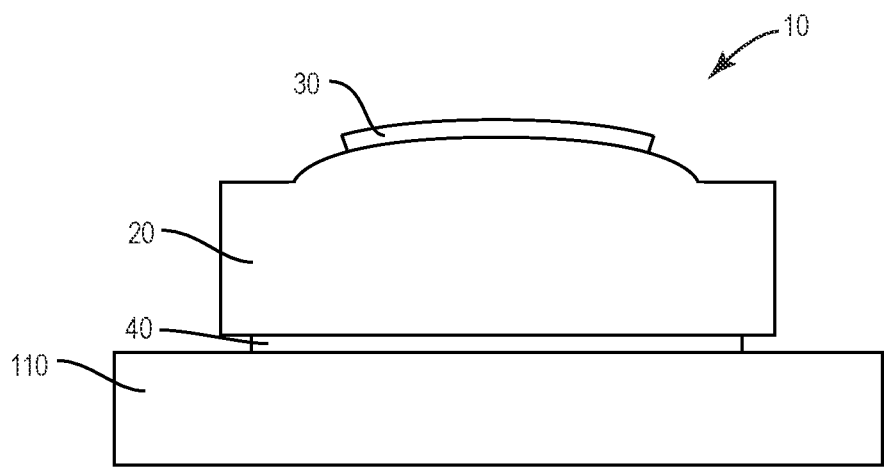
FIG. 3 is a schematic drawing of a contoured resonator bonded to a substrate.

FIG. 3 schematically illustrates a resonator 10 that has a contoured shape. In this example, the resonator 10 includes a convex shape. The resonator 10 includes a central piezoelectric layer 20, a first electrode 30 on a first side, and a second electrode 40 on an opposing second side. The resonator 10 is further bonded to a substrate 110 that provides structural support.

The resonator 10 includes a piezoelectric crystal 20 that is positioned between first and second electrodes 30, 40. In one example, the piezoelectric crystal 20 is contoured to focus the energy. FIGS. 4 and 5 include examples of the piezoelectric crystal 20 with a first surface 21 having a contoured section 26 with a concave shape. Planar sections 27 are positioned at both outer ends. A second surface 22 includes a contoured section 26 with the same or different shapes.

The concave shape extends into the piezoelectric crystal 20 towards a longitudinal centerline C/L. The concave contouring of one or both surfaces 21, 22 confines the energy towards the vertical centerline C when the piezoelectric crystal 20 is used in a resonator 10. This confinement of the energy raises the quality factor Q of the resonator 10.

The concave shapes of the contoured sections 26 can vary. The shape includes the diameter, depth, and curvature. In one example, the concave shape is uniform about a center that lies on the vertical centerline C. Further, the shape of the planar sections 27 can vary. The concave shape may have other kinds of symmetry, such as, elliptical, and may altogether be asymmetrical also depending on particular applications.

The electrodes 30, 40 extend over various sections of the first and second surfaces 21, 22 of the piezoelectric crystal 20. An active region 11 is formed where the piezoelectric material 20 is overlapped by the electrodes 30, 40. FIGS. 6 and 6A include a piezoelectric crystal 20 having a round shape with a contoured section 26 having a concave shape on the first surface 21 and a continuous planar section 27 on the second surface 22 (referred to as plano-concave). The concave section 26 is centered about the vertical centerline C. The electrode 30 is positioned on the first surface 21. The electrode 30 extends over the entirety of the contoured section 26 and limited portions of the planar section 27. Electrode 40 extends across a majority of the second surface 22.

FIGS. 7 and 7A include a piezoelectric crystal 20 with contoured first and second surfaces 21, 22 each having concave shapes (referred to as concave-concave). The electrode 30 is positioned on the first surface 21 and the electrode 40 positioned on the second surface 22. Each of the electrodes 30, 40 extends across and entirety of the respective concave contoured sections 26 and onto a portion of the planar section 27 to form the active region. In this example, each of the contoured sections 26 includes the same concave shape. In another example, the concave shapes are different.

FIGS. 8 and 8A include a piezoelectric crystal 20 with a contoured section 26 with a concave shape on the first surface 21 and a planar second surface 22 (referred to as plano-concave). Electrode 30 is positioned on the first surface 21 and electrode 40 is positioned on the second surface 22 to form the active region 11. A transition region 28 is formed around the central region 23 of the piezoelectric crystal 20 and separates the active region 11 with the peripheral region 24 that forms the inactive region 12. The transition region 28 results from etching of the piezoelectric crystal 20 which provides for the contouring of the first and second surfaces 21, 22. In this example, the transition region 28 extends between the first and second surfaces 21, 22. In other examples, the transition region 28 extends into one or both of the surfaces 21, 22 but does not extend completely through the piezoelectric crystal 20.

In one example, a tether 25 extends between and connects the central region 23 and the peripheral region 24. The electrode 30 extends over the tether 25 and forms a narrow connection 31. The connection 31 provides for electrical connection to a pad area (not illustrated). In one example, the connection 31 is used for spurious capacitance and spurious signal reduction and does not overlap with the diametrically opposite electrical connection on opposite tether on the bottom face.

Figure 10:
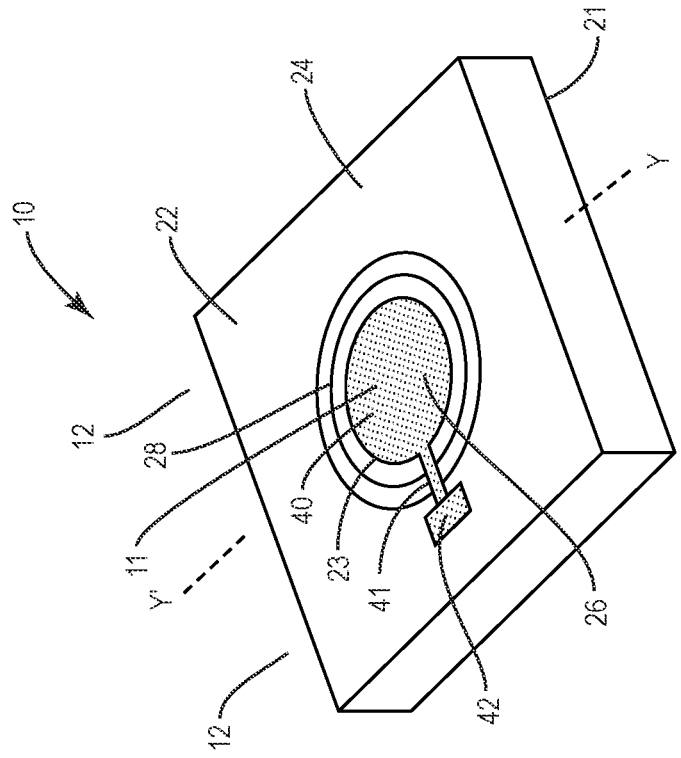
FIG. 10 is the bottom perspective view of the resonator of FIG. 9 with planar or profiled faces with the transition region between the active and inactive areas.
Figure 9:
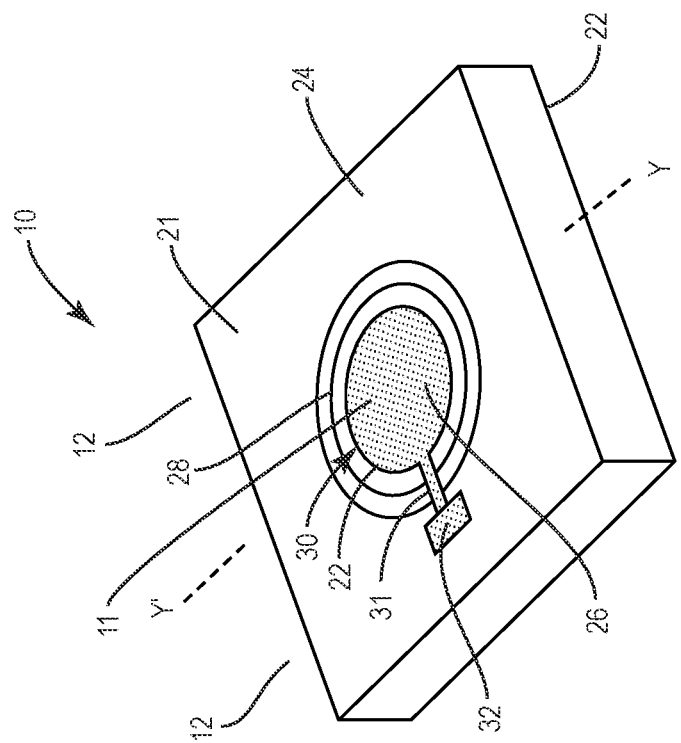
FIG. 9 is a top perspective view of a resonator with planar or profiled faces with a transition region between the active and inactive areas.
Figure 11:
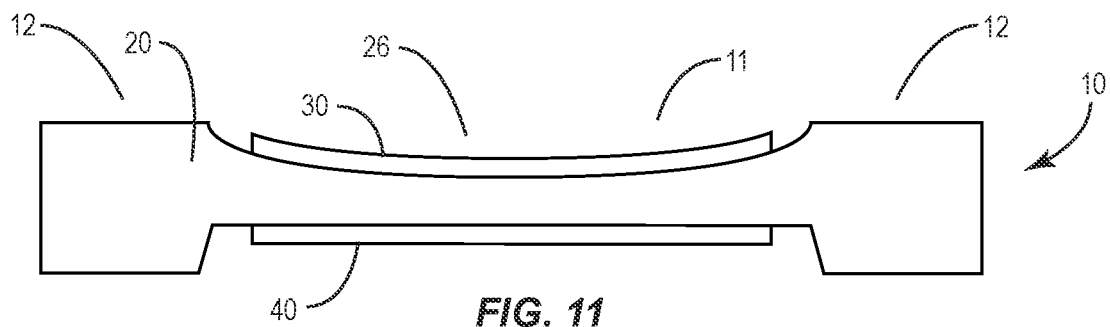
FIGS. 11-15 are schematic cross section views of various resonators with one or two concave sections formed in the active region.

FIG. 9 illustrates a top perspective view of a resonator 10 and FIG. 10 illustrates a bottom perspective view. Each of the first and second surfaces 21, 22 includes a transition region 28 that includes a trough formed between the central region 23 that forms the active region 11 and the peripheral region 24 that forms the inactive region 12. Contoured sections 26 each having concave shapes are formed on the first and second surfaces 21, 22. Each electrode 30, 40 includes a circular shape that extends across an entirety of the respective contoured section 26. Connectors 31, 41 lead respectively to and provide an electrical connection to pads 32, 42. The connector 41 and pad 42 on the bottom surface 22 may be located diametrically opposite to connector 31 and pad 32 on the top surface 21 to reduce spurious signal generation.

In one example, the commonly used dimensions of the electrodes 30, 40 and resonant frequencies of resonators 10 made from monolithic piezoelectric crystal 20 have a narrow range between about 5 mm and 10 mm for electrode diameters, 100 to 200 nm for electrode thickness and 5-10 MHz resonant frequencies for quartz. The transition region 28 is usually a fraction of a millimeter and the recessed planar or contoured area is substantially equal or marginally bigger than the electrode area. The dimensions scale down as the operating frequency of the resonator 10 goes up. Moreover, the dielectric constant of the piezoelectric material 20 used also determines the optimal electrode area.

Figure 12:
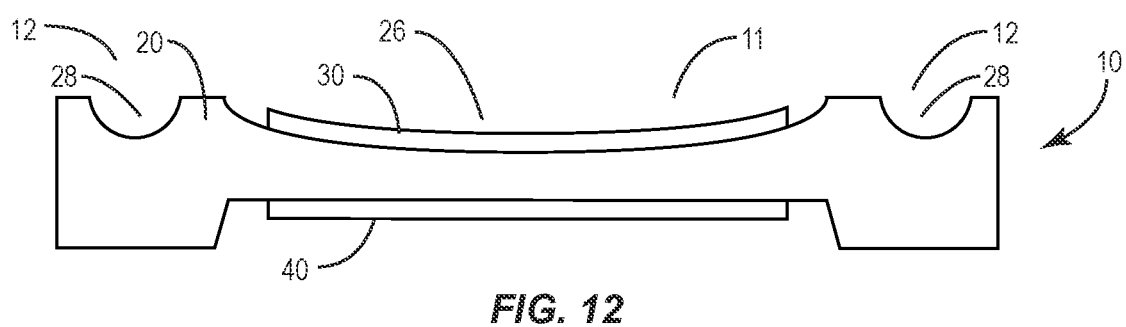
Figure 13:
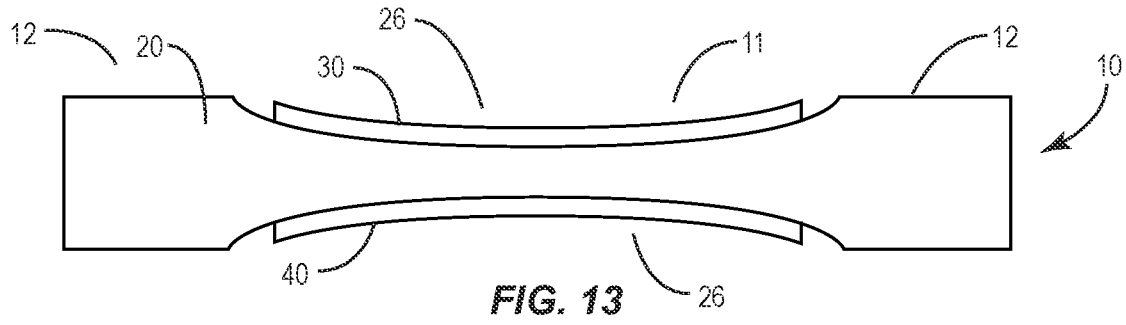
Figure 14:
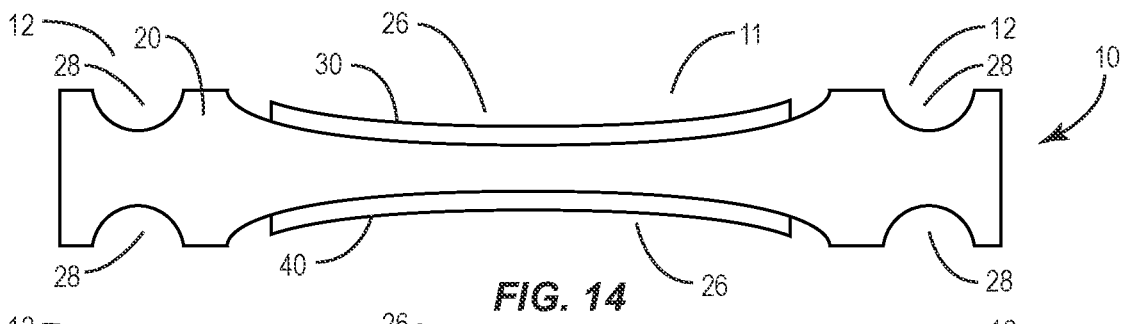
Figure 15:
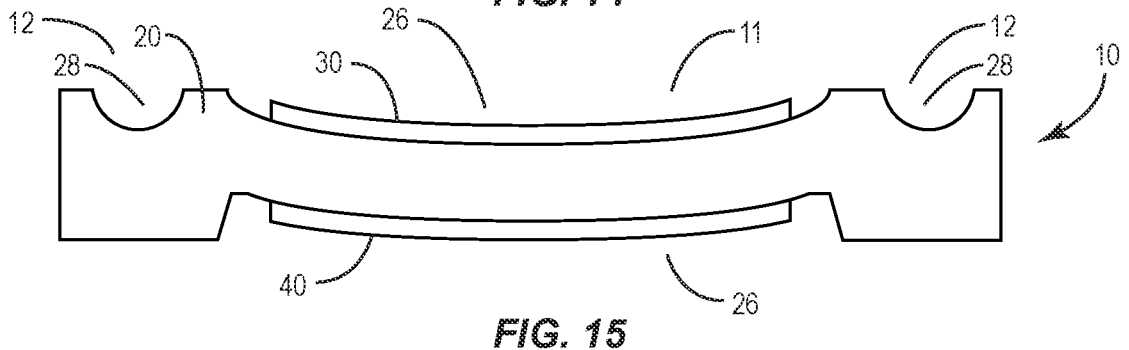

The concave shapes of the contoured sections 26 of one or both surfaces 21, 22 can vary. FIGS. 11-15 illustrate various resonators 10 with one or two contoured sections 26 with concave shapes in the active region 11. Inactive regions 12 extends around the active region 11 and assist in confining energy in the resonator 10 in the active region 11 and enhance quality factor Q and reduce spurious resonances. In some examples, transition regions 28 are formed by trenches formed into one or both of the first and second surfaces 21, 22 as illustrated in FIGS. 12, 14, and 15. The transition regions 28 can include various shapes and sizes.

In one example, the resonators 10 are dual thickness shear mode resonators 10. The resonators 10 can be used in a variety of different applications. Applications include both monomodal and bimodal. The bimodal resonators may have two varieties—two shear modes from same thickness shear mode family or two modes from different thickness shear mode family. In one example for temperature compensated operation, a sensor 100 can use two separate single mode resonators 10—one for sensing and the other for temperature compensation. In examples using dual mode resonators 10, one mode is used for sensing and the other for temperature compensation with both the modes existing in the same resonator 10.

For monomodal applications, the piezoelectric crystal 20 can include but is not limited to Lithium Niobate and Lithium Tantalate. In one example for modal purity, piezoelectric crystals 20 include crystallographic equivalents where pure thickness shear modes exist and thickness extensional modes are substantially absent. In examples using Lithium Niobate and Lithium Tantalate, cut angles are 163° rotated Y-cut and 165° rotated Y cut respectively. In addition, more recent material constants and their temperature variations can be taken into account to further optimize these angles. Variables such as the particular device structure, mounting, and packaging methods also may have an effect the choice of the optimal cut angles. In one example, an angular tolerance on the cut angles of the piezoelectric crystal 20 may be necessary.

Figure 16:
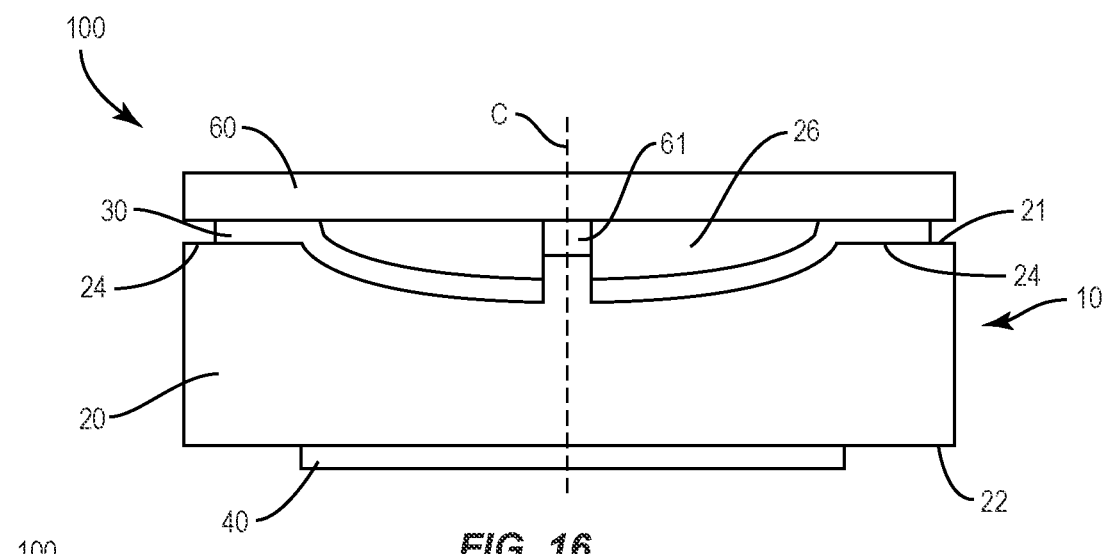
FIG. 16 is a schematic cross section view of a temperature and/or pressure sensor using the same piezoelectric material for the resonator and the top sensing plate.

The resonator 10 with a single or dual contoured section 26 can be used in a variety of different applications and devices 100. FIG. 16 includes a resonator 10 incorporated into a pressure and/or temperature sensor 100. In one example, the sensor 100 is configured for the environmental pressure to be transmitted by a top plate 60 to the resonator 10 below through a central post 61. The central post 61 contacts against the resonator 10 at the vertical centerline C. The thickness and hence stiffness of the top plate 60 determines the range of pressures detectable and the accuracy. In one example, the top plate 60, the post 61, and the piezoelectric crystal 20 are made of same piezoelectric material to minimize the problem of thermal mismatch. The post 61 may be created at the same time when the concave section 26 is being formed by etching. Subsequent metallization for electrodes will leave a small island of metal on the post 61 making it flush with the planar area of the resonator 10. Subsequent bonding of the thin top plate 60 will result in the pressure sensor structure.

In another example, a post 61 is formed on the top plate 60 also by etching. The post 61 is sized to make contact with the metallized electrode 30 of the concave shape of the contoured section 26 of the resonator 10 after bonding. In other examples, the top plate 60 and/or the post 61 are made of different materials. In such cases, the post 61 may be made of some other material and may be formed on the top plate 60 by various methods of deposition prior to bonding.

FIG. 16 includes a single-sided structure as the piezoelectric crystal 20 includes a single contoured section 26 with a concave shape. Other examples include double-sided pressure sensors 100 in which the piezoelectric crystal 20 includes two concave sections 26.

Figure 16A:
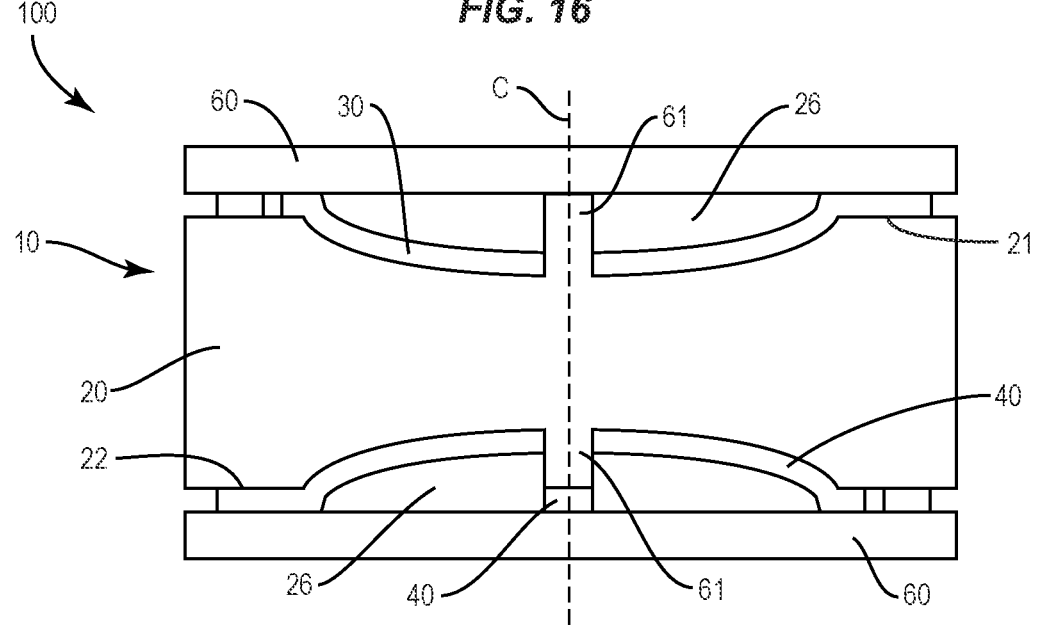
FIG. 16A is a schematic cross section view of a sensor.

FIG. 16A includes a double-sided pressure sensor 100. Each of the first and second surfaces 21, 22 include contoured sections 26 with concave shapes. Posts 61 extend outward from the contoured sections 26 and support top plates 60.

Figure 16B:
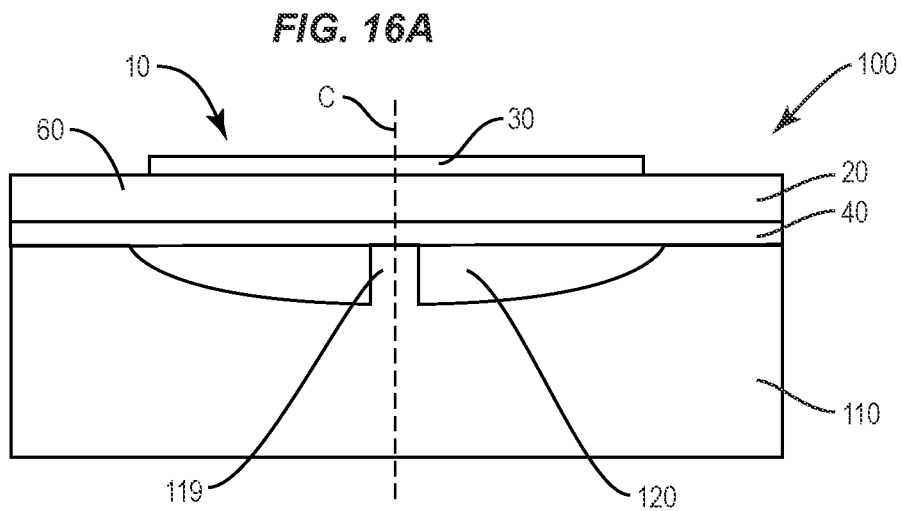
FIG. 16B is a schematic cross section view of a sensor.

FIG. 16B illustrates a sensor 100 with the top plate 60 formed by a resonator 10. In this example, the resonator 10 is a piano-piano type. In other examples, the resonator 10 can include one or two contoured sections 26. The resonator 10 is bonded to the substrate 110 by the material of the electrode 40. In other examples, adhesives are used to bond the resonator 10 to the substrate 110. The cavity 120 can include a concave shape as illustrated, or a rectangular shape. In one example (not illustrated), a cap extends over the resonator 10.

In another example, the resonator 10 of FIG. 16B includes voids that extend into the piezoelectric layer 20 a limited distance to reduce energy leakage from the active region 11 to the inactive region 12.

Figure 17:
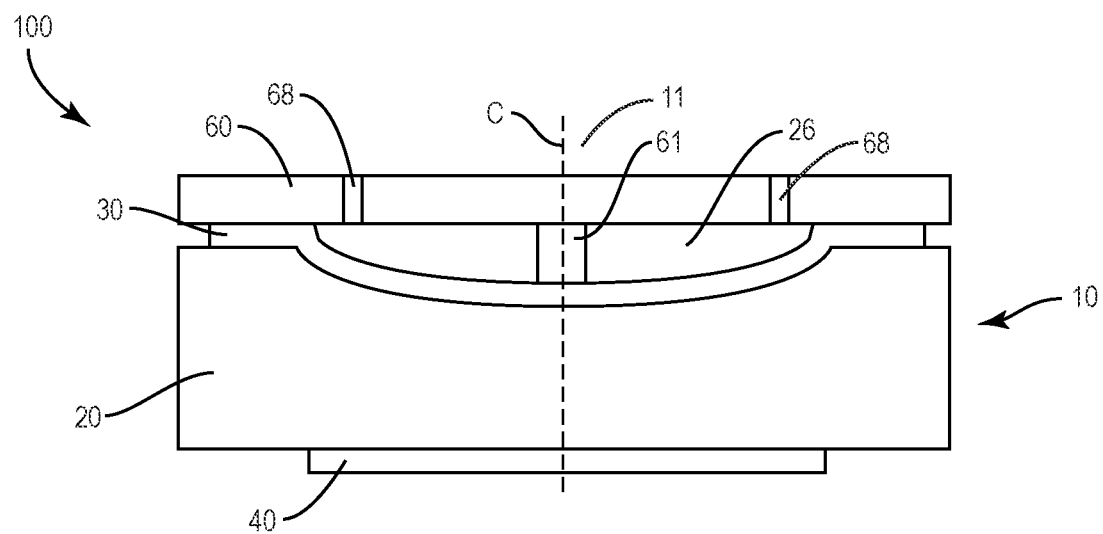
FIG. 17 is a schematic cross section view of a sensor.
Figure 18:
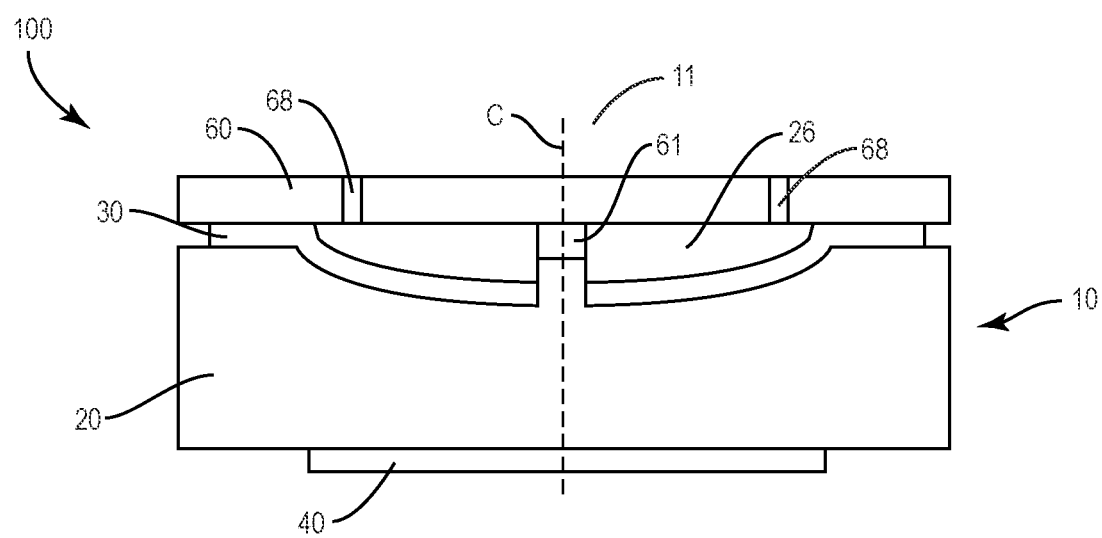
FIG. 18 is a schematic cross section view of a sensor.

Another application includes use of the resonators 10 within a shear stress sensor 100. Shear stress sensors 100 measure various aspects, including but not limited to frictional or drag force, laminar flow and vortex flow. Examples of resonators 10 in shear stress sensors 100 are illustrated in FIGS. 17 and 18. Each sensor 100 includes a top plate 60 and a post 61. The top plates 60 and posts 61 can be constructed from the same or different materials as the piezoelectric crystal 20. FIG. 17 includes an example in which each of the piezoelectric material 20, the top plate 60, and the post 61 are constructed from different materials. FIG. 18 includes the piezoelectric material 20 and a first section of the post 61 constructed from the same material, and the top plate 60 constructed from a different material. A second section of the post 61 is formed from the metallic material of the electrode 30.

Figure 17A:
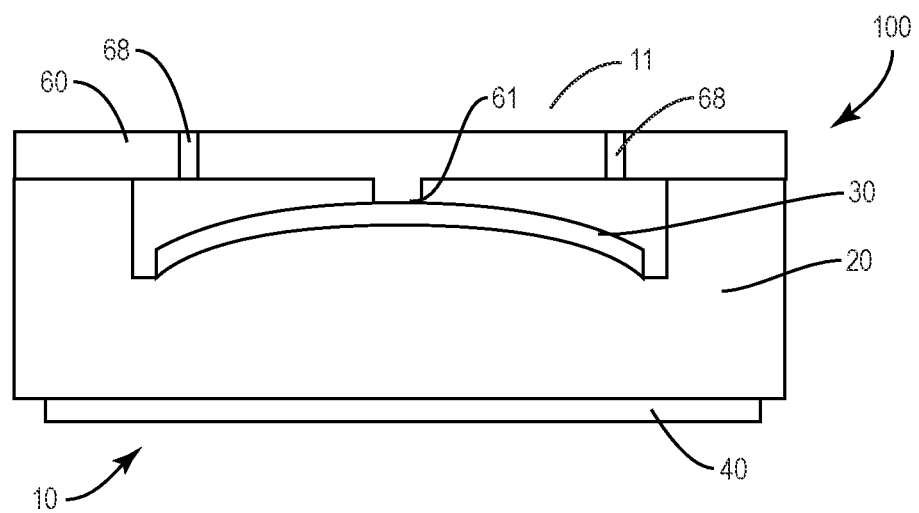
FIG. 17A is a schematic cross section view of a sensor.
Figure 18A:
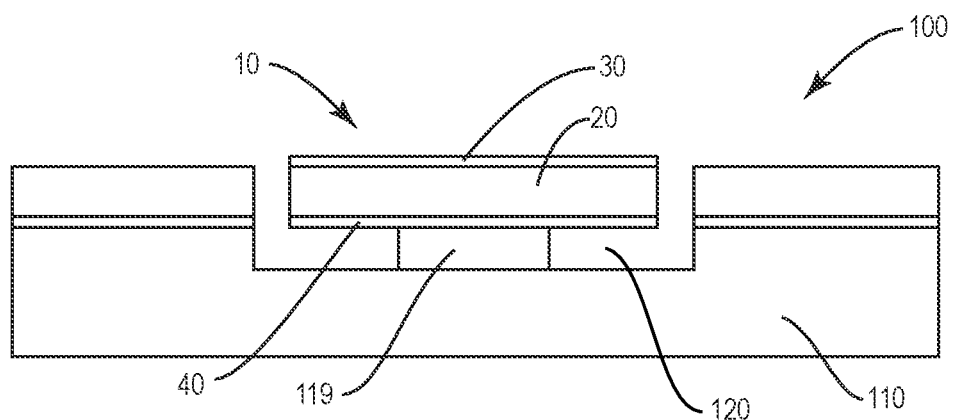
FIG. 18A is a schematic cross section view of a sensor.

FIGS. 17 and 17A include examples of shear force sensors 100 with the sensing element of the top plate 60 and post 61 being passive and modulates the response of the underlying resonator 10. FIG. 18A includes a sensor 100 with the active resonator 10 the sensing element. The resonator 10 is isolated from the underlying passive substrate 110. In this example, the resonator 10 is positioned on a post 119 that extends from the substrate 110. In other examples, the resonator 10 is planar or contoured on one or both faces without causing substantial disturbances to the fluid flow.

For each sensor 100, the top plate 60 and post 61 are floating elements that sense the shear force. In one example, voids 68 extend through the top plate 60 to isolate the central section and the post 61 providing for the floating configuration. In other examples, the resonator 10 is isolated from a remainder of the device 100, such as illustrated in FIG. 18A.

The sensors 100 are positioned to be flush with the surrounding gas or liquid flow offering minimal disturbance to the flow pattern. The force applied through the top plate 60 and post 61 alters the resonant frequency of the underlying resonator 10. The top plate 60 and post 61 can have various shapes. In one example, multiple disjointed floating elements are distributed over the active area 11 of the resonator 10 to alter the overall modal shape of the piezoelectric crystal 20 to get a sense of planar distribution of the shear stress. The shear stress sensors 100 can include resonators 10 with piezoelectric crystals 20 of various shapes.

In some examples, the various structures are fabricated in a monolithic crystal block at lower frequencies (tens of MHz). As operating frequencies go up, the required membrane thickness scales down to the point where it becomes difficult to handle such thin layers. It may be advantageous to fabricate devices 100 on a bonded substrate 110 as opposed to a monolithic crystal block.

In the various examples, the electrodes 30, 40 include a continuous layer that extends over the piezoelectric material 20. One or both electrodes 30, 40 can also be formed as arrays of discrete electrode members that are spaced apart across the piezoelectric layer 20. The electrode members can include the same or different shapes and/or sizes, and can be arranged in various patterns to form the array.

Figure 19:
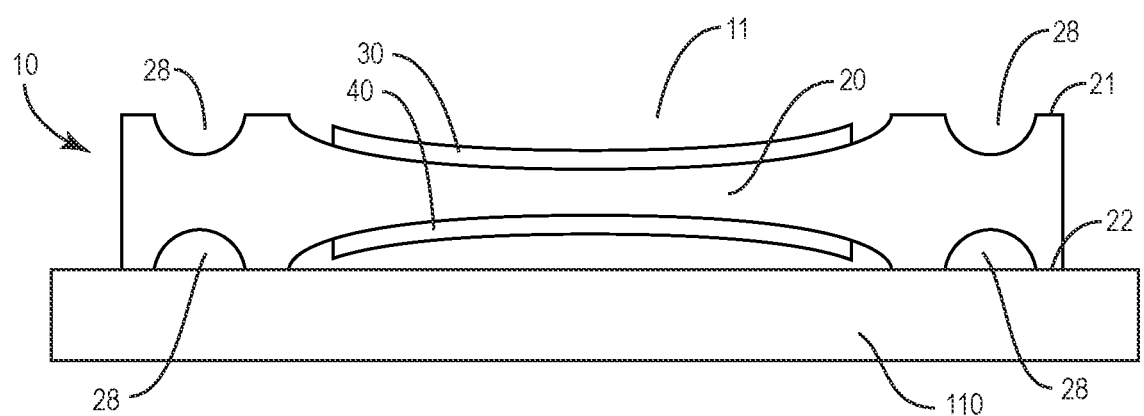
FIG. 19 is a schematic cross section view of a resonator mounted to a substrate.
Figure 20:
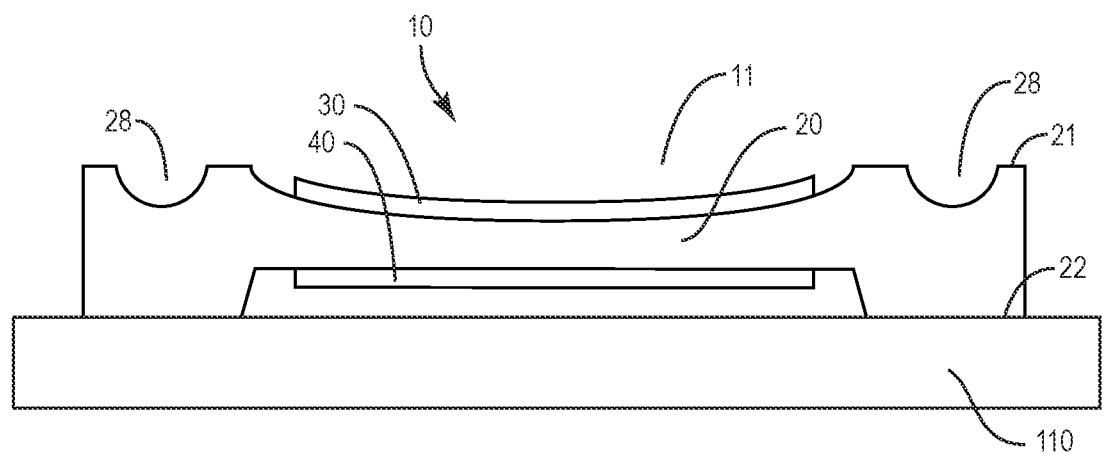
FIG. 20 is a schematic cross section view of a resonator mounted to a substrate.

FIGS. 19 and 20 includes examples with resonators 10 having transition regions 28 formed into one or both of the first and second sides 21, 22 of the piezoelectric crystal 20. The transition regions 28 form single and double-sided isolation regions. FIG. 19 includes a double-contoured resonator 10 with a concave-concave configuration. Notches extend into the piezoelectric material 20 from both sides 21, 22 to form the transition region 28 to prevent energy leakage from the active region 11. FIG. 20 includes a single-contoured resonator 10 with a plano-concave configuration. Notches extend into the piezoelectric layer 20 from just the first side 21 to form the transition region 28.

Figure 21:
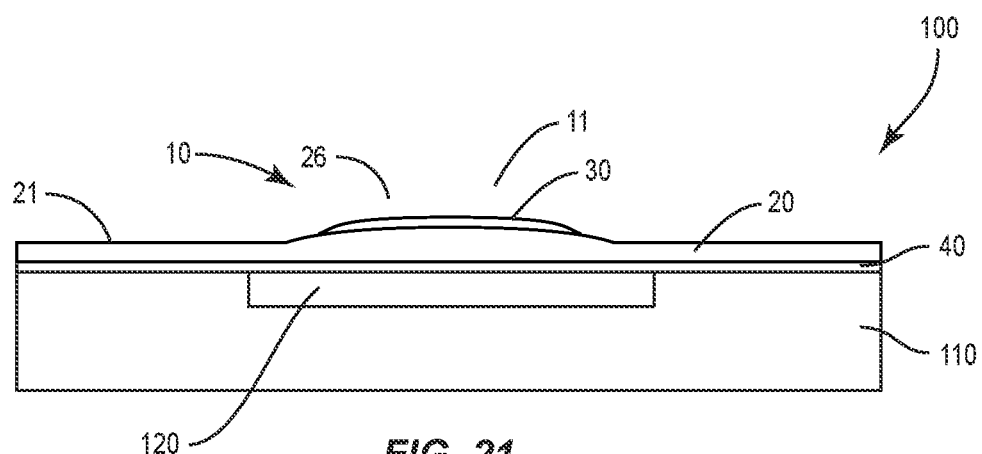
FIG. 21 is a schematic cross section view of a resonator mounted to a substrate.
Figure 22:
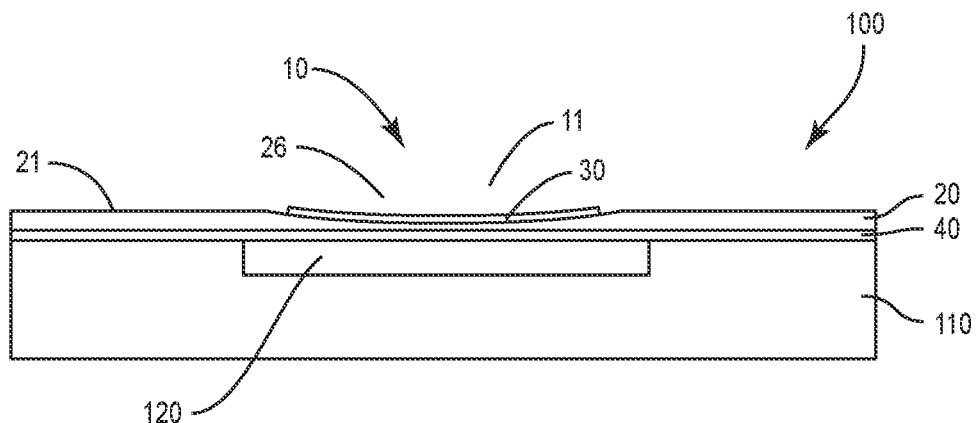
FIG. 22 is a schematic cross section view of a resonator mounted to a substrate.

FIG. 21 includes a resonator 10 mounted to a substrate 110 with the resonator 10 having a convex shaped contoured section 26 formed on the first surface 21 of the piezoelectric layer 20. FIG. 22 includes an example with a convex shaped contoured section 26 on the first surface 21. The size and shape of the contoured sections 26 can vary, with each of these examples including the sections 26 centered over the cavity 120. The active region 11 of the resonators 10 extend over a cavity 120 formed in the substrate 110.

In one example for exceptional thermal performance, the substrate 110 is made of the same cut and orientation as the piezoelectric layer 20. The active region 11 is connected to the supporting substrate 110 with an uninterrupted connection through a transition area or by localized tethers 25. Using different fabrication process steps, different combinations of concave and convex shapes on the two faces of the resonator 10 are also realizable. The cavities 120 under the active region 11 of the resonator 10 can be pre-fabricated before bonding or may be created by introduction of a sacrificial layer between the bottom electrode 40 and the substrate 110.

Figure 23:
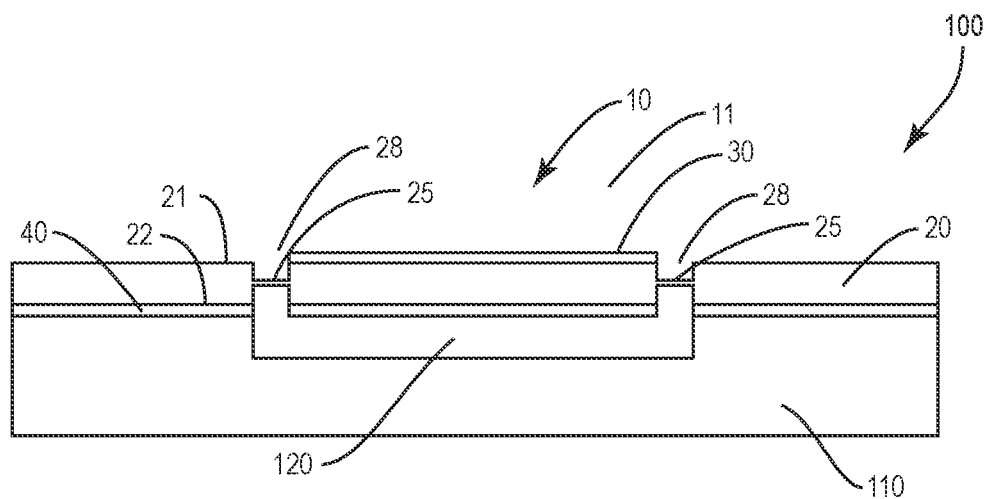
FIG. 23 is a schematic cross section view of a resonator mounted to a substrate.
Figure 24:
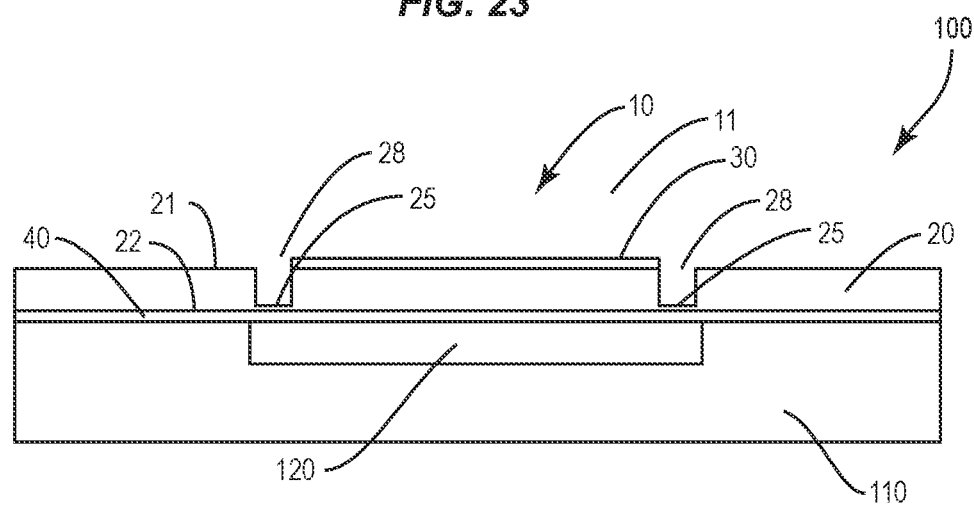
FIG. 24 is a schematic cross section view of a resonator mounted to a substrate.
Figure 25:
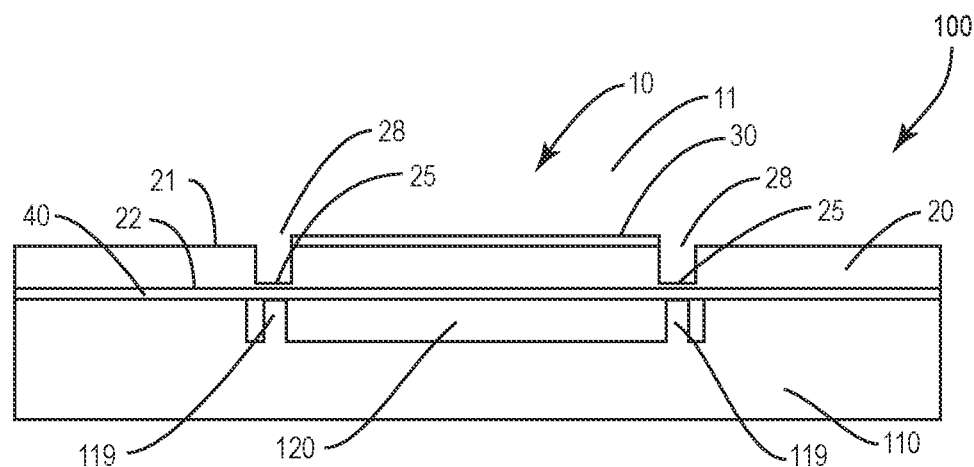
FIG. 25 is a schematic cross section view of a resonator mounted to a substrate.

FIGS. 23, 24, and 25 illustrate examples of resonators 10 mounted on substrates 100. The transition regions 28 are created by micromachining the piezoelectric layer 20 to form the isolation region around the active region 11 of the resonator 10. The isolation region 28 are formed by notches that extend inward from one or both surfaces 21, 22 of the piezoelectric material 20. The resonator 10 is further bonded to a substrate 110, creating a suspended configuration. One or more cavities 120 are formed between the substrate 110 and resonator 10. In one example, one or more of the cavities 120 are formed by sacrificial layer etching. In one example, the substrate 110 is made with the same material as the piezoelectric layer 20 to reduce thermal mismatches. FIG. 25 includes posts 119 that extend from the substrate 110 to further support the resonator 10. The posts 119 are integral with the substrate 110 and fabricated during formation of the cavity 120. In another example, the posts 119 are separate elements that are connected to the substrate 110. In one example, these configurations are applicable to resonators 10 for use with frequency control and pressure sensors 100.

In one example, the acoustic energy confinement of the resonators 10 in these structures of FIGS. 23, 24, and 25 is obtained just by creating the transition region 28 that includes notches and or posts around the piano-piano resonator 10. In these examples, the notches include vertical sidewalls and can terminate at the electrode 40 or include a relatively thin layer of piezoelectric material 20 remaining above the electrode 40. In another example, the acoustic energy confinement of the resonators 10 is formed by the one or more concave notches such as the examples of FIGS. 19 and 20. In one example, the active regions 11 of the resonators 10 is contoured by one or two contoured sections 26 for further energy confinement.

In one example, the resonators 10 are fabricated using wafer level fabrication for singulating the devices 100 post fabrication. In one example, the entire resonator 10 is encapsulated. In another example, such as a shear stress sensor 100, the process includes just a single sided encapsulation.

Figure 26:
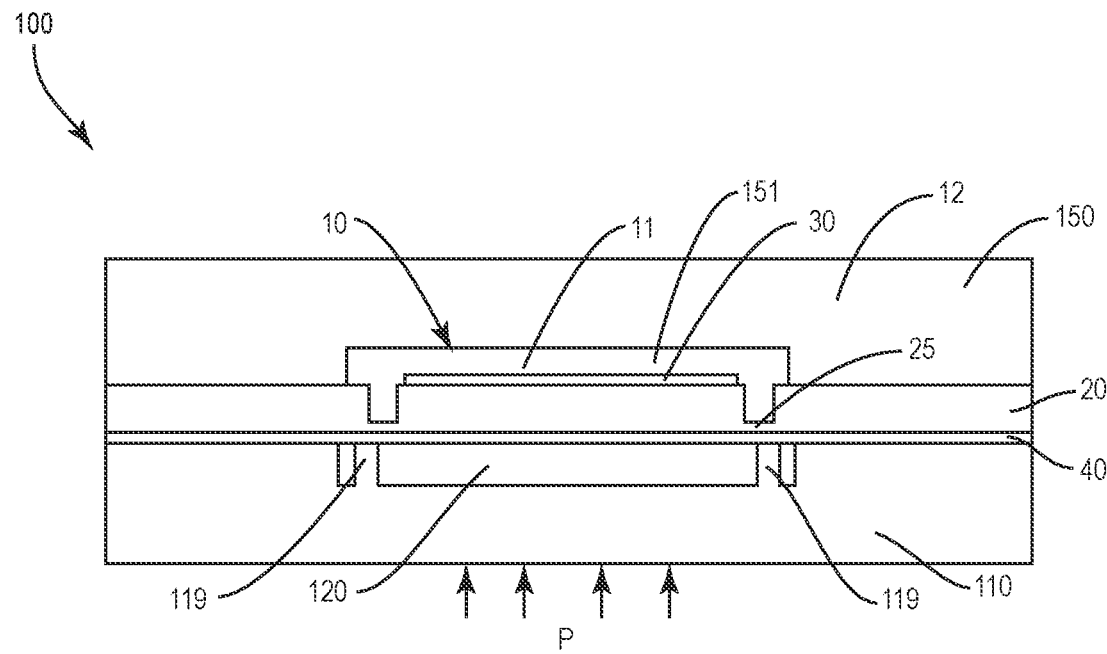
FIG. 26 is a schematic cross section view of a resonator mounted to a substrate and encapsulated with a cap.

In various examples, the device 100 includes the resonator 10 encapsulated to provide better energy confinement. FIG. 26 illustrates one encapsulation that includes a cap 150 positioned over the resonator 10. The cap 150 is bonded to the electrode 30 at the inactive region 12. The cap 150 includes a cavity 151 to provide for the active region 11 of the resonator 10 to be spaced away from the cap 150. In one example, the cap 150 is micromachined to removed material to form the cavity 151 in the face of the cap 150. This process can be performed prior to the cap 150 being bonded to the electrode 30, or after the bonding using a sacrificial layer and release hole approach.

Figure 27:
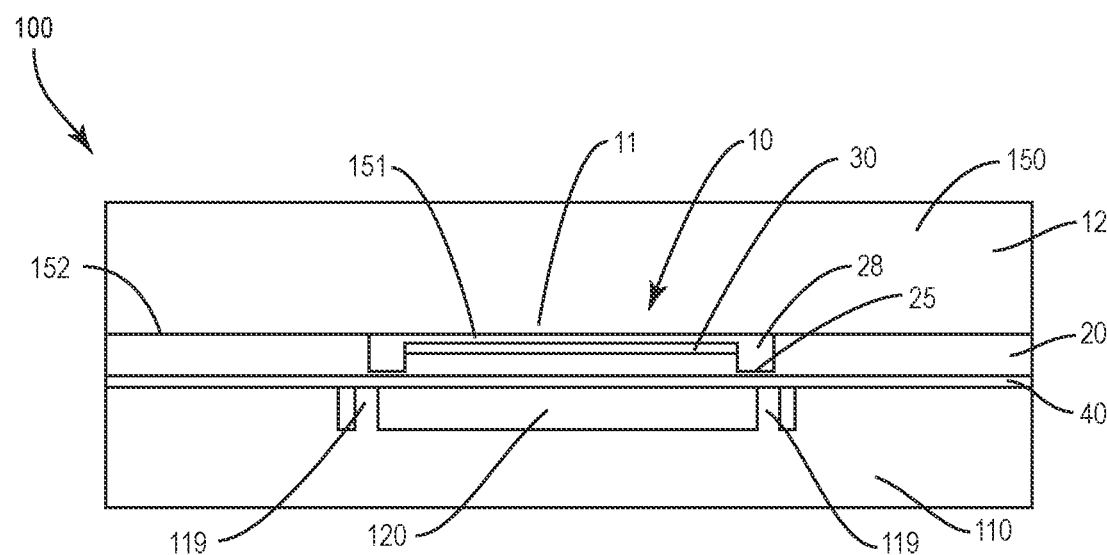
FIG. 27 is a schematic cross section view of a resonator mounted to a substrate and encapsulated with a cap.

FIG. 27 includes an example with a cap 150 that does not include a cavity 151. In this example, the active region 11 is thinner than the inactive region 12. This difference in height provides for the cap 150 to be attached to the inactive region 12 and be spaced away from and out of contact with the active region 11. In one example, the cap 150 includes a planar face 152 that contacts against the inactive region 12 and is spaced away from the active region 11. In one example, the piezoelectric layer 20 in the active region 11 is thinner than in the inactive region 12. This provides for the difference in height that prevents contact of the flat face 152 of the cap 150. In one process of fabricating the device 100, the piezoelectric layer 20 in the active region 11 is processed to reduce the height. After processing, the electrode 30 is attached to the surface and then the cap 150 is attached as described above.

Figure 28:
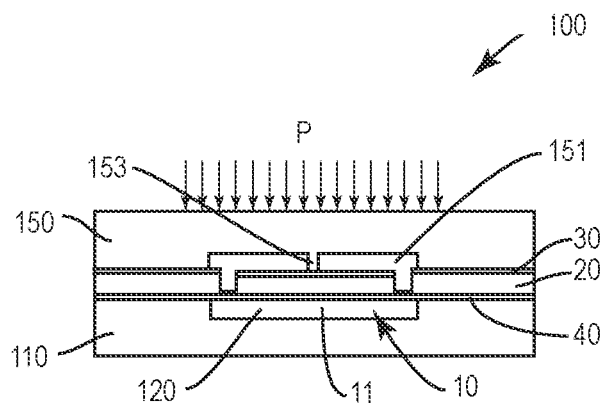
FIG. 28 is a schematic cross section view of a resonator mounted to a substrate and encapsulated with a cap.

FIG. 28 illustrates an example of a pressure sensor with the cap 150 including a post 153 that contacts the active region 11 of the resonator 10. Pressure P exerted on the cap 150 is detected by the resonator 10 through this configuration.

Figure 29:
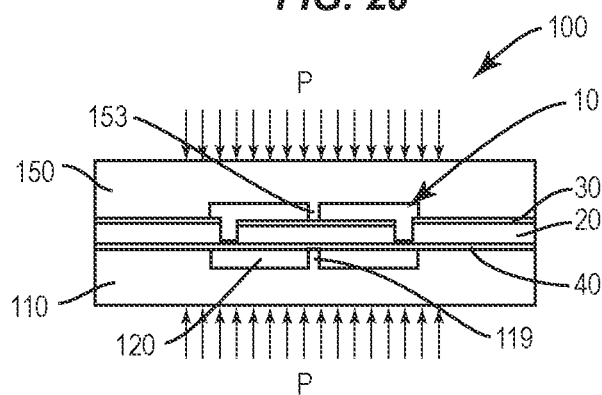
FIG. 29 is a schematic cross section view of a resonator mounted to a substrate and encapsulated with a cap.

FIG. 29 includes a similar device 100 with a cap 150 having a post 153 that contacts the active region 11. In this example, the active region 11 is supported by a post 119 that extends across the cavity 120. Pressure P exerted on the cap 150 is detected by the resonator 10 through contact with the post 153. Further, pressure P exerted on the substrate 110 is detected by the resonator 10 through contact with the post 119.

In the various examples, the cap 150 can be constructed from the same or different materials as the substrate 110.

Figure 30:
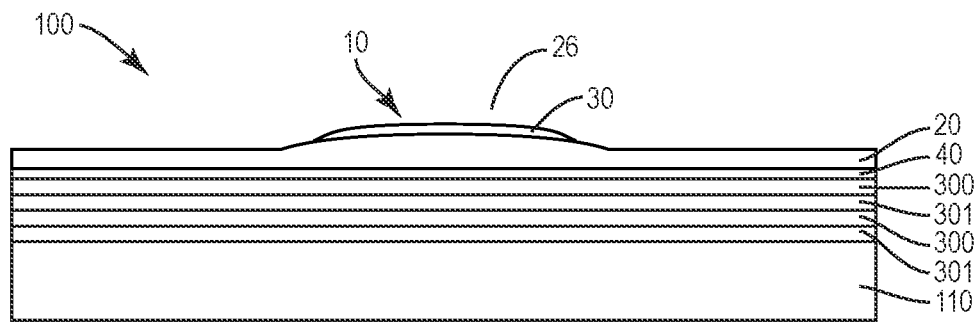
FIG. 30 is a schematic cross section view of a resonator mounted to a Bragg mirror.
Figure 31:
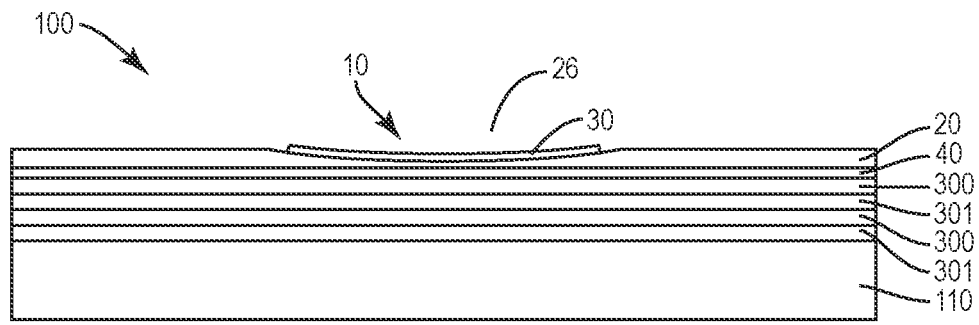
FIG. 31 is a schematic cross section view of a resonator mounted to a Bragg mirror.

Microfabrication on bonded substrate 110 is also possible with Bragg mirrors 300 instead of cavities 120 as shown in FIGS. 30 and 31. The Bragg mirrors 300 which also act as reflectors for the acoustic energy wave like a cavity, are composed of alternating materials of higher and lower impedances compared to the impedance of the piezoelectric layer 20. The periodicities, composition, and number of such alternating layers, are chosen to provide the necessary bandwidth of reflection for the desired operation of the device 100. The periodicity is defined as the total thickness of two adjacent layers of higher and lower impedance materials in a Bragg mirror 300. FIG. 30 includes a resonator 10 with a convex shaped contoured section 26. FIG. 31 includes a resonator 10 with a concave shaped contoured section 26. One or more layers 301 are positioned at various levels of the device 100, such as between the Bragg mirror 300 and the substrate 110. The one or more layers 301 may act as an adhesive layer or may have other functional properties. In special cases, when the mode of operation is thickness shear or shear horizontal, the Bragg mirror layers 300 may also be substituted by a single layer of material having an impedance lower than the impedance of the piezoelectric layer 20 and the substrate 110. In another variation, the piezoelectric crystal 20 may be directly above the substrate 110 with just the metal electrode layer in between. In another example, a similar Bragg mirror 300 can be formed on top of the resonator 10 by deposition techniques and provide encapsulation by the same principle as the bottom Bragg mirror 300.

Figure 32:
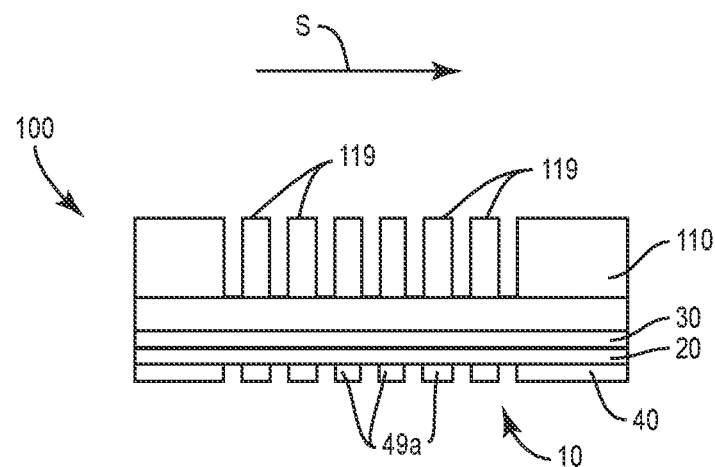
FIG. 32 is a schematic cross section view of a resonator mounted to a substrate that includes posts that extend outward from a body.

FIG. 32 illustrates an example of a shear force sensor 100 that includes a resonator 10 and is mounted to a substrate 110. The resonator 10 includes an electrode 40 formed as discrete electrode members 49a configured as an array 49 and spaced apart and mounted to the piezoelectric layer 20. The individual electrode members 49a can include a variety of different shapes and sizes and can be arranged in uniform and non-uniform configurations. In one example, the electrode members 49a each include the same shape and size and are aligned in a symmetrical grid of rows and columns.

Figure 33A:
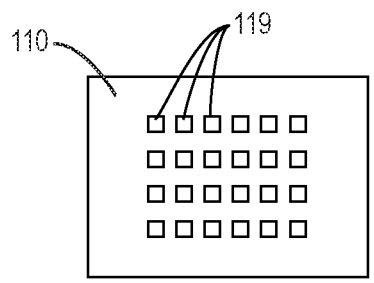
FIG. 33A is a top view of the substrate with posts of FIG. 32.
Figure 33B:
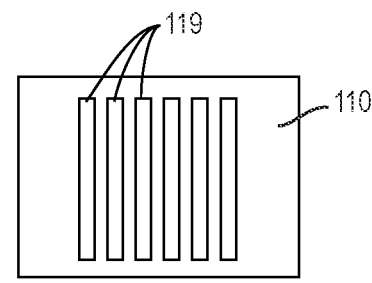
FIG. 33B is a top view of the substrate with posts of FIG. 32.

The substrate includes posts 119 that extend outward away from the resonator 10. The posts 119 are spaced apart with intermediate gaps. FIG. 33A illustrates one example with the posts 119 aligned in a grid of rows and columns. FIG. 33B includes posts 119 having an elongated shape and aligned in a row across the substrate 110. The substrate 110 can be formed as a single integrated member that includes a base substrate and the posts 119, or two or more sections that are mounted together as illustrated in FIG. 32. In one example, a first section is mounted to the resonator 10 and a second section includes the posts 119.

The posts 119 form a resonant body over a transducer array of the resonator 10. When a shear force F bends the posts 119, the resonance characteristics of the whole posts 119 changes. These structures can be used for sensing stress over an area. In one example, the posts 119 have very high aspect ratios and are fabricated with materials such as silicon by Deep Reactive Ion Etching (DRIE). The sensor 110 can also be used to measure shear stress in a gas or fluid flow. In one example, the sensor 100 is mounted on a solid surface with the posts 119 facing downward to measure surface shear.

Figure 34:
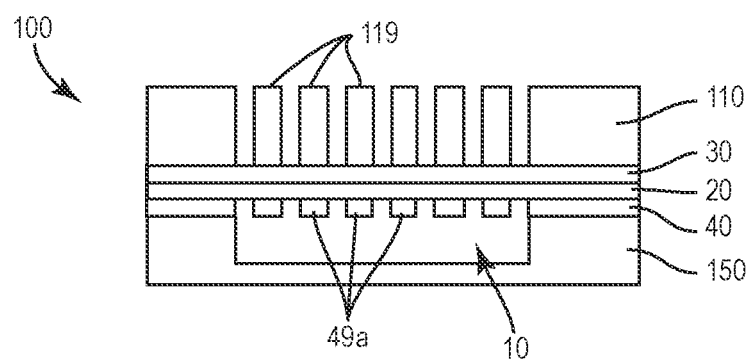
FIG. 34 is a schematic cross section view of a resonator mounted to a substrate that includes posts that extend outward from a body and encapsulated with a cap.

FIG. 34 includes a similar sensor 100 that includes a cap 150 that extends over the electrode array 49a.

In the examples of FIGS. 32 and 34, the posts 119 can form the resonant bodies. In another example, the resonant bodies are formed by the entire layered stack that aligns with the posts 119, including the stacked sections of the electrodes 30, 40 and piezoelectric layer 20.

Figure 35:
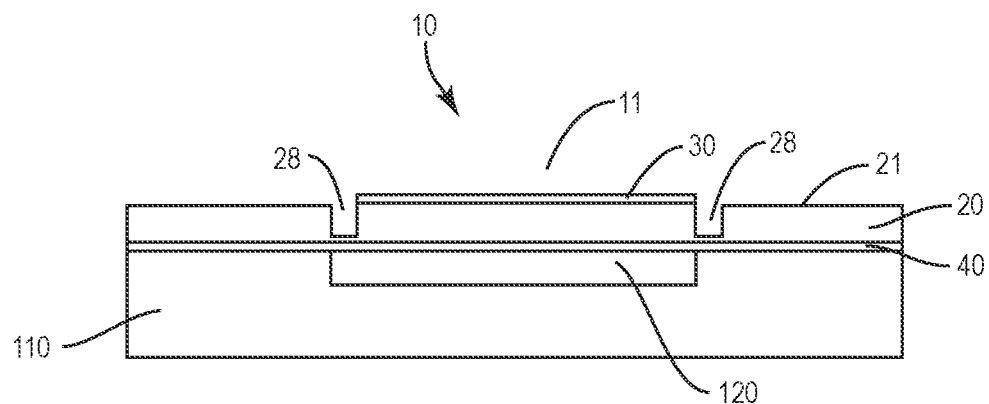
FIG. 35 is a schematic cross section view of a resonator mounted to a substrate.
Figure 36:
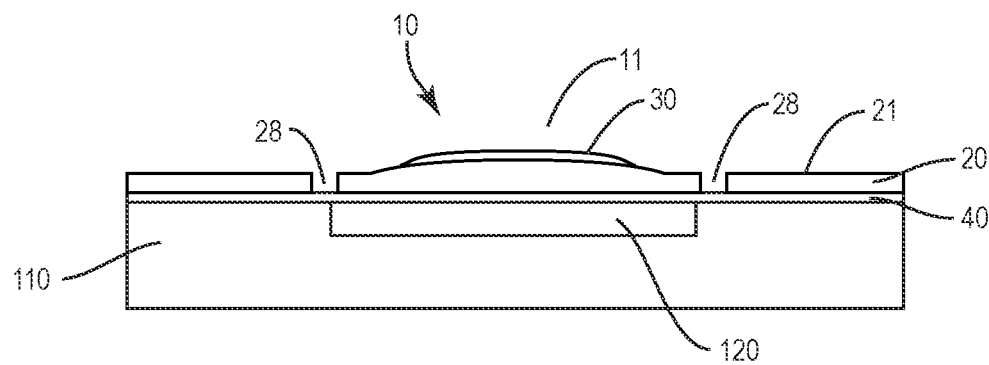
FIG. 36 is a schematic cross section view of a resonator mounted to a substrate.
Figure 37:
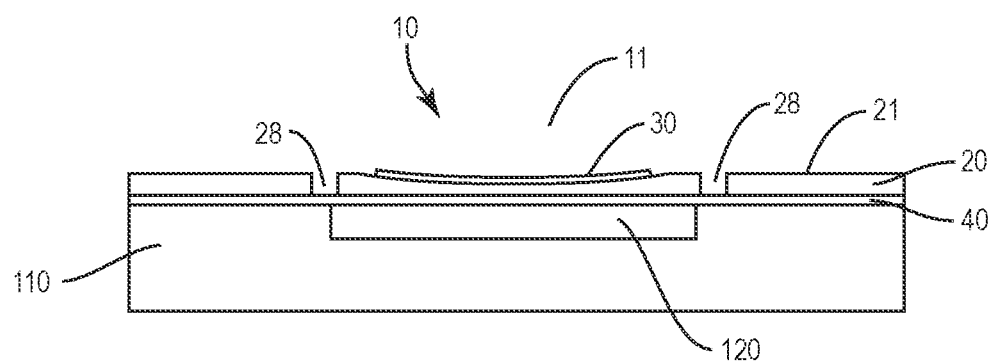
FIG. 37 is a schematic cross section view of a resonator mounted to a substrate.

FIGS. 35, 36, and 37 illustrate examples of resonators 10 mounted to substrates 110. The transition region 28 is formed by notches that extend into the first side 21 of the piezoelectric crystal 20. The depth of the notches can partially extend into the piezoelectric crystal 20 as illustrated in FIG. 25 with a layer of piezoelectric material 20 remaining at the bottom of the notch, or fully extend into the piezoelectric crystal 20 to expose the second electrode 40 as illustrated in FIGS. 36 and 37. The notches form a transition region 28 to prevent energy from leaking from the active region 11. To further prevent leakage, the active region 11 can include a contoured shape.

Figure 38:
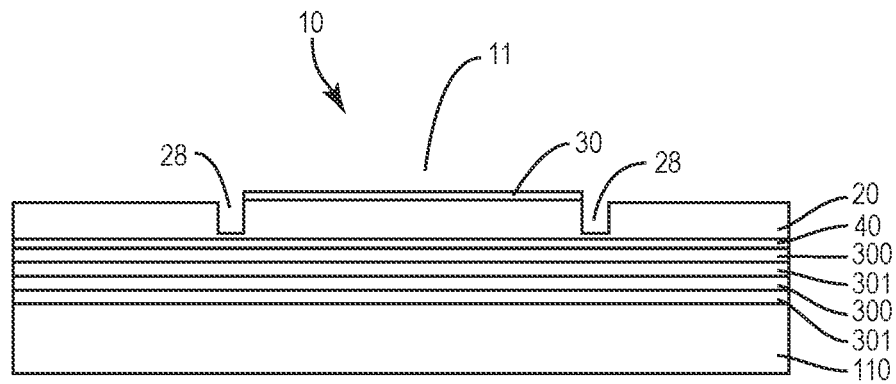
FIG. 38 is a schematic cross section view of a resonator mounted to a Bragg mirror.
Figure 39:
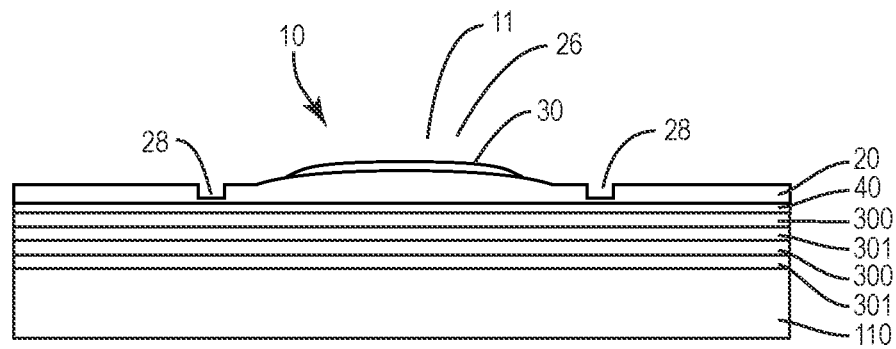
FIG. 39 is a schematic cross section view of a resonator mounted to a Bragg mirror.
Figure 40:
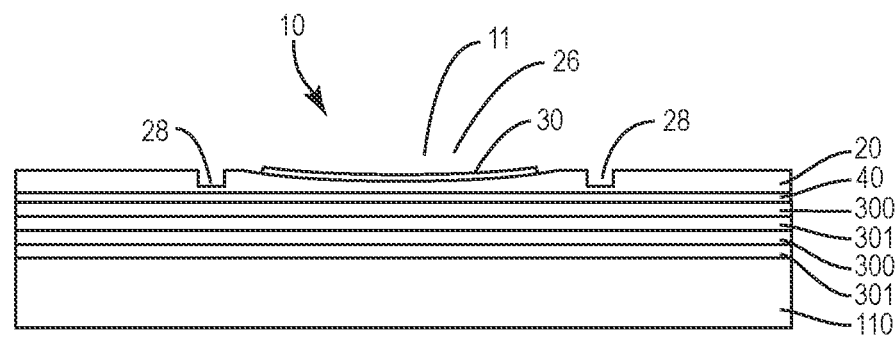
FIG. 40 is a schematic cross section view of a resonator mounted to a Bragg mirror.

FIGS. 38, 39, and 40 illustrate similar examples with the use of Bragg mirrors 300. One or more transition regions 28 extend around the active region 11. The depth of the notches that form the transition regions can vary. Further, the active region 11 can include a contoured section 26.

The various structures can be used for a variety of applications. Examples include but are not limited to frequency controlling elements, pressure sensors, temperature sensors, and shear stress sensors. The resonators 10 can perform one or more of emitting energy, sensing the emitted energy that returns, and sensing one or more aspects or an environment. These functions can be performed by separate devices 100, or combined devices 100 that perform multiple different functions. The various devices 100 are able to control the aspects of the emitted acoustic energy, as well as the aspects of sensing the fluid 130.

Figure 41:
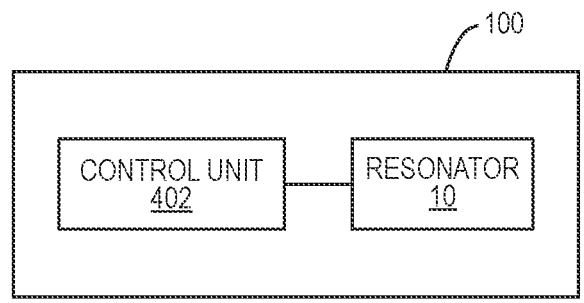
FIG. 41 is a schematic diagram of a control unit connected to a device.

The devices 100 can include a control unit 402 that controls the overall operation. FIG. 41 schematically illustrates a device 100 that includes a control unit 402 operatively connected to the device 100. In this example, the control unit 402 is incorporated into the device 100. In another example, the control unit 402 can be separated and connected by one or more electrical leads. In another example, the control unit 402 is remote and communicates wirelessly with the device 100. In one example, the control unit 402 includes an oscillator circuit to apply oscillating voltages to the electrodes 30, 40. In one example, the control unit 402 includes an amplification circuit.

The control unit 402 controls the overall operation of the device 100. The control unit 402 can include a control circuit that controls one or more operations of the device 100 according to program instructions stored in a memory circuit. The control circuit includes one or more circuits, microcontrollers, microprocessors, hardware, or a combination thereof. Memory circuit includes a non-transitory computer readable storage medium storing program instructions, such as a computer program product, that configures the control circuit to implement one or more of the techniques discussed herein. Memory circuit can include various memory devices such as, for example, read-only memory, and flash memory. Memory circuit can be a separate component or can be incorporated with the control circuit.

The control unit 402 can include a communications circuit that provides for communication functionality for the device 100. In one example, the communications circuit can provide for transmitting and/or receive signals from remotes sources, such as through different forms of signaling such as one or more of a cellular interface that enables communication with a mobile communication network, and a WLAN interface configured to communicate with a local area network, a personal area network interface, such as a Bluetooth interface, and a Near Field Communication interface that provides for short-range wireless connectivity technology that uses magnetic field induction to permit devices to share information with each other over short distances.

The control unit 402 can also include a user interface to provide for a user to operate the device 100. The interface can include a display to display various information as well as one or more input devices such as a key pad, buttons, touch screen for inputting commands to control one or more functions of the device 100. The control unit 402 can supply and/or receive electrical signals with the device 100 to activate and sense the device 100, In one example, the control unit 402 alternates between transmitting and receiving signals.

Figure 42:
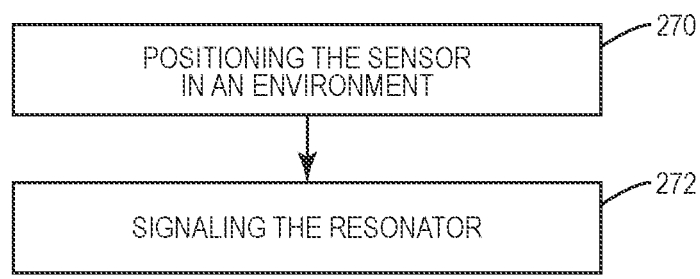
FIG. 42 is a flowchart diagram of a method of using a device.

FIG. 42 illustrates a method of sensing a condition of an environment. The method includes positioning a sensor 100 in the environment (block 270). The sensor 100 includes a contoured resonator 10 with a piezoelectric crystal 20 having at least one contoured section 26. The method includes signaling the resonator 10 and detecting a physical attribute of the environment (block 272).

Another use for the resonators 10 is with a lab-on-a chip application. Lab-on-chip is an intense area of development where acoustic transduction and detection have found a prominent place. TSM resonators 10, particularly, quartz microbalance resonators 10 are traditionally used in biosensing. The quartz resonator 10 usually has a linker and a receptor layer coated on the electrode 30, 40 on one or two of the surfaces 21, 22. A piezoelectric crystal 20 with one or two contoured sections 26 interact with the surrounding liquid in a different way to offer additional performance advantage in such sensors 100. Examples of the piezoelectric crystal 20 include quartz or various other suitable piezoelectric material supporting thickness shear mode. Similarly, contoured transducers 100 may be used for generating acoustic waves of modes other than thickness shear, such as, thickness extensional mode. Various pressure fields may be created by using contoured transducers 100. Contoured transducers 100 of circular symmetry may create a point pressure field while transducers 100 of cylindrical symmetry may create a line pressure field. By varying the frequency of the transducer 100, it may be possible to move these fields laterally or vertically. The pressure distribution in the fluid will also be determined by whether the substrate 110 containing the fluidic cavity 130 is hard or soft. Moreover, due to the thickness variation of a contoured transducer 100 in the active area 11, for thickness extensional mode, different areas of the transducer 100 will generate different frequencies with maximum efficiency. This added versatility also adds additional degrees of freedom in device design and resulting functionalities. These devices have potential applications in confinement and other types of manipulations of particles suspended in the liquid medium.

FIGS. 43A, 43B, and 43C illustrate different variations of such transducers 100. The bonding between the resonator 10 and the bottom substrate 110 may be accomplished by different methods, such as, direct, metallic, dielectric, or adhesive. Various combinations of planar, concave, or convex contouring may be chosen to offer different functionalities.

One context of use for the resonators 10 are for an acoustic wave device 100 that emits an acoustic field for acoustophoresis. Acoustophoresis is a noncontact method of particle and cell manipulation/separation of a fluid due to induced motion when the fluid is subjected to an acoustic field. The acoustic field emitted by the device 100 causes the particles in the fluid to move in the acoustic field when the acoustic properties of the particles differ from the surrounding medium. The acoustic field causes the particles in the fluid that are affected by the acoustic field and move toward nodes or antinodes. The extent of the movement depends upon physical properties like size, density, or compressibility of particles. The use of acoustic wave devices 100 with resonators 10 is applicable to numerous biomedical and clinical applications.

FIGS. 43A, 43B, and 43C illustrate one example with the resonator 10 configured to focus the acoustic field in the cavity 130. In these examples, the resonators 10 have a contoured shape. The cavities 130 in the substrates 110 include vertical walls and a flat bottom.

Figure 44:
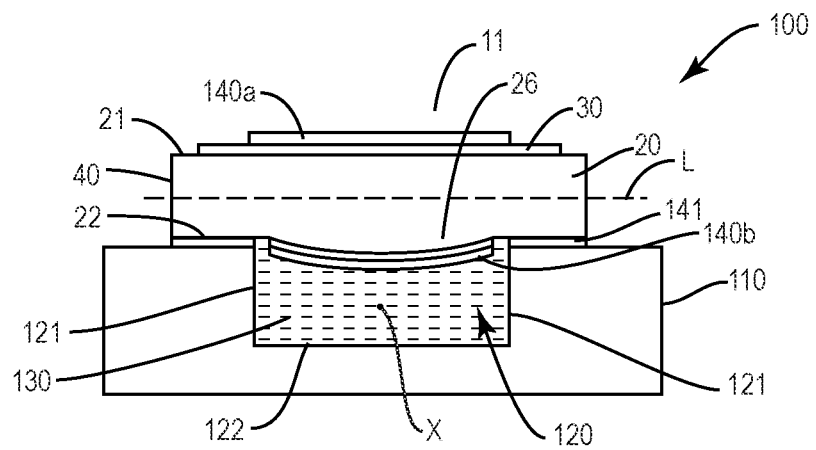
FIG. 44 is a schematic cross section view of an acoustic wave device.

FIG. 44 illustrates another example of an acoustic wave device 100. The device 100 is attached to a substrate 110 and extends over a cavity 120 formed in the substrate 110. Fluid 130 with suspended particles is positioned in the cavity 120 and acted upon by the acoustic field that is emitted by the device 100.

The device 100 includes a piezoelectric crystal 20. In one example, the piezoelectric crystal 20 is a single crystal. In another example, the piezoelectric crystal 20 is a grown material with an orientation that provides for wave generation. The piezoelectric crystal 20 includes a first surface 21 that faces away from the cavity 120 and a second surface 22 that faces towards the cavity 120. The second surface 22 includes a central contoured section 26 with a convex shape at the active region 11 that extends over the cavity 120 and flat sections at the inactive region 12 that extend over the substrate 110 away from the cavity 120. The piezoelectric crystal 20 is attached to the substrate 110 by an adhesion layer 141 that can include various materials including but not limited to polymer, adhesive, and metal.

Electrode 30 is positioned on the first surface 21 and extends across the cavity 120. Electrode 40 is positioned on the convex section 26 of the second surface 22. The electrodes 30, 40 overlap over the cavity 120 and form the active region 11 of the device 100.

One or more functional layers 140 extend across the active region 11. In one example, functional layer 140a is attached to the electrode 30. The functional layer 140a can be a protective layer and/or a backing layer to suppress spurious reflections. Functional layer 140b is attached to the electrode 40. Functional layer 140b can be a protective layer, or an impedance matching layer that provides for the device 100 to efficiently transfer the acoustic energy to the fluid 130. The electrode 40 and/or functional layer 140b are in direct contact with the fluid 130 in the cavity 120.

The convex second surface 22 focuses the energy that is emitted by the device 100 in the cavity 120. In one example, the convex shape of the second surface 22 focuses the energy to a single point X within the cavity 120.

The substrate 110 can be constructed from various materials, including but not limited to silicon and glass. The substrate 110 is rigid with the cavity 120 having a defined shape. The cavity 120 includes side walls 121 and a bottom wall 122. In one example, the side walls 121 are straight and perpendicular to a longitudinal axis L of the piezoelectric crystal 20. In one example, the side walls 121 are perpendicular to the bottom wall 122. In the example of FIG. 44, the convex shape of the contoured section 26 focuses the acoustic energy in the fluid 130. This shape prevents a standing wave pattern from occurring within the fluid 130, despite the cavity 120 having vertical walls and a rigid shape. Under certain conditions, however, rigid perpendicular side walls 121 and a flat bottom wall 122 may give rise to spurious reflections and unwanted standing wave patterns.

In such cases, a soft substrate (i.e., non-rigid) 110 is chosen. In one example, the soft substrate is polymethylsiloxane (PDMS).

Figure 45:
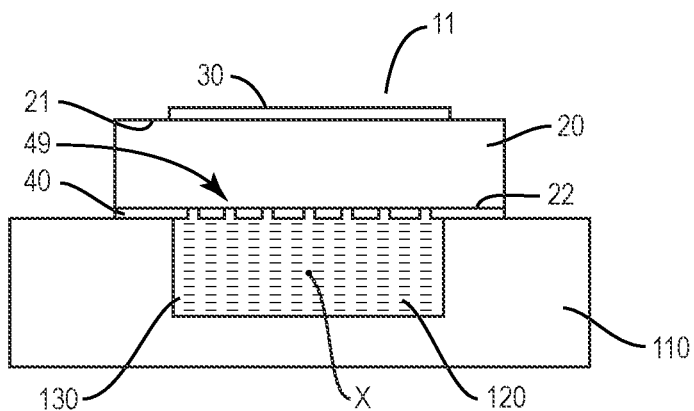
FIG. 45 is a schematic cross section view of an acoustic wave device.
Figure 46:
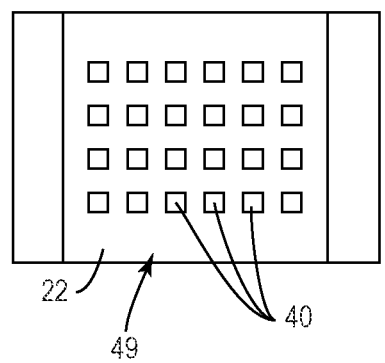
FIG. 46 is a bottom view of an electrode array of the acoustic wave device of FIG. 45.

The acoustic energy can also be focused in other manners. FIG. 45 includes an example with the electrode 40 comprising an electrode array 49 that focuses the acoustic energy in the cavity 120. In this example, the electrode array 49 is formed from multiple electrodes 40 positioned on the second side 22 of the piezoelectric crystal 20. In the example of FIG. 45, the second side 22 is flat with other examples including a contoured shape. The electrode array 49 comprises separate electrodes 40 that extend on the second side 22. FIG. 46 illustrates a bottom view of the electrode array 49 that includes multiple electrodes 40 that are connected to the piezoelectric crystal 20. The electrodes 40 are spread apart across the second side 22 and form the active region 11 of the device 100. The electrodes 40 can include various connection schemes. In one example, the electrodes are recessed in the piezoelectric crystal 20.

The electrode array 49 focuses the acoustic energy in the cavity 120. This focus prevents and/or reduces the extent of a standing wave pattern from being formed within the fluid 130 in the cavity 120. The electrode array 49 operates under the same principle as phased arrays in which the ultrasonic energy is focused at a given point X by electronically delaying the excitation of the elements in the middle of the array 49. In one example, implementation of the array 49 on a single crystal wafer 20 with an optimized cut angle and single step fabrication of the electrodes 40 with a metallization step considerably simplifies the construction.

In one example (not illustrated), a functional layer is applied to the electrode array 49. A functional layer can also be applied to electrode 30.

In the previous examples, the piezoelectric crystal 20 and/or electrode 40 are constructed to focus the emitted energy in the cavity 120. In other examples, the cavity 120 is constructed to focus the energy. This constructed includes a curved contoured shape of the cavity 120 to focus the energy.

FIGS. 47A and 47B illustrate an example with the cavity 120 having a contoured shape that is hemispherical or hemi-ellipsoidal. The cavity 120 is contained within the interior of the substrate 110. The piezoelectric crystal 20 has planar first and second surfaces 21, 22. Single electrodes 30, 40 extend across the first and second surfaces 21, 22 respectively. In this example, the contoured shape of the cavity 120 focuses the energy. In one example, the curved shape of the cavity 120 prevents the formation of a standing wave pattern in the fluid 130. In one example, the energy is emitted as a point pressure field that focuses the energy at a point within the cavity 120.

FIGS. 48A and 48B illustrate another example with the cavity 120 having a curved contoured shape that focuses the energy. In this example, the cavity 120 has an elongated shape that extends across the width of the substrate 110. The piezoelectric crystal 20 includes flat first and second surfaces 21, 22, with electrodes 30, 40 on each of the surfaces. The curvature of the cavity 120 prevents the formation of a standing wave pattern in the fluid 130. In one example with a cavity 120 having an elongated shape, the energy is emitted in a line pressure field along a length of the cavity 120.

The focusing of the signal emitted by the device 100 provides for mounting multiple transducers on a piezoelectric crystal 20. The devices 100 can include various configurations and can be the same or different. Further, the cavities 120 formed in the substrate 110 can be the same or different.

In the examples described above, the piezoelectric crystal 20 forms a single device 100. In other examples, the piezoelectric crystal 20 is integrated into multiple different devices 100. The number and type of devices 100 can vary depending upon the use. In one example, the devices 100 are configured to produce different wave types.

Figure 49:
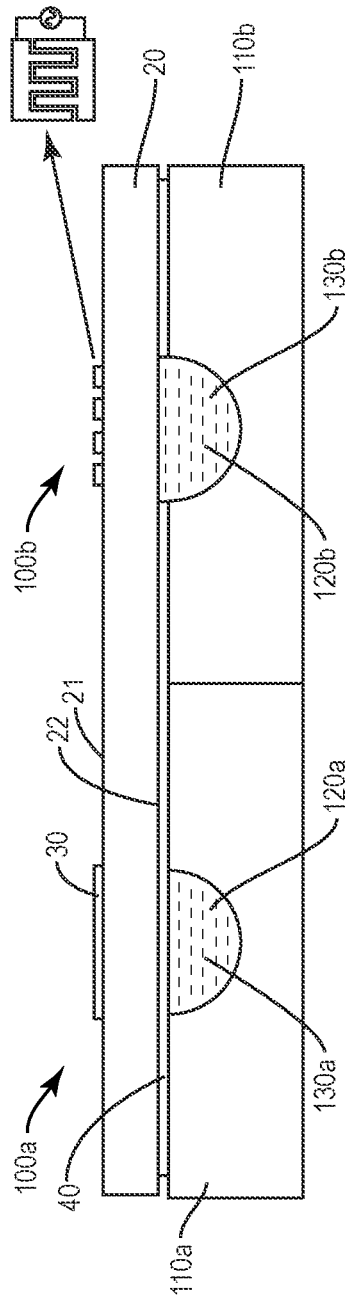
FIG. 49 is a side schematic view of a pair of acoustic wave devices integrated in a single unit.

FIG. 49 includes a pair of devices 100a, 100b that share a common piezoelectric crystal 20. The devices 100a, 100b are spread apart on the piezoelectric crystal 20. The first device 100a is positioned at a first cavity 120a in a first substrate 110a. The second device 110b is positioned at a second cavity 120b in a second substrate 110b. Each of the cavities 120a, 120b includes a curved contour that focuses the energy of the respective device 100a, 100b. The first device 100a includes an active region 11 that extends over the cavity 120a and is formed by overlapping electrodes 30, 40. The second device 100b is a Reflected Bulk Wave (RBAW) or a plate wave transducer with interdigital electrodes on one side. The transducers may have arbitrary angular orientation on the surface depending on the direction in which the particular wave type is excited with maximum efficiency. In a sensing application, the bottom electrode or surface may be coated with a functional layer which is sensitive to the particles being sensed. In this example, the electrode 40 is a single member that extends across a portion or section of device 100a. In another example, the electrode 40 includes patterning to form an array of two or more separate electrodes 40.

Figure 49A:
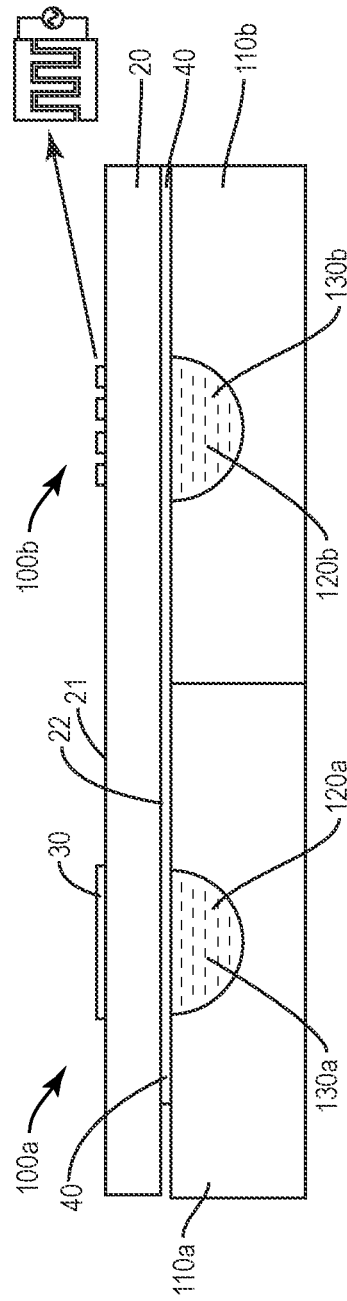
FIG. 49A is a side schematic view of a pair of acoustic wave devices integrated in a single unit.

FIG. 49A includes a similar example as illustrated in FIG. 49. In this example, the electrode 40 extends across the second surface 22 and forms a portion of both devices 100a, 100b.

In the examples of FIGS. 49 and 49A, a functional layer can be applied to the piezoelectric layer 20 that is sensitive to the particles or specimens being detected.

In another example, the devices 100a, 100b are physically isolated such as by etching out trenches between them in the piezoelectric layer 20.

Figure 50:
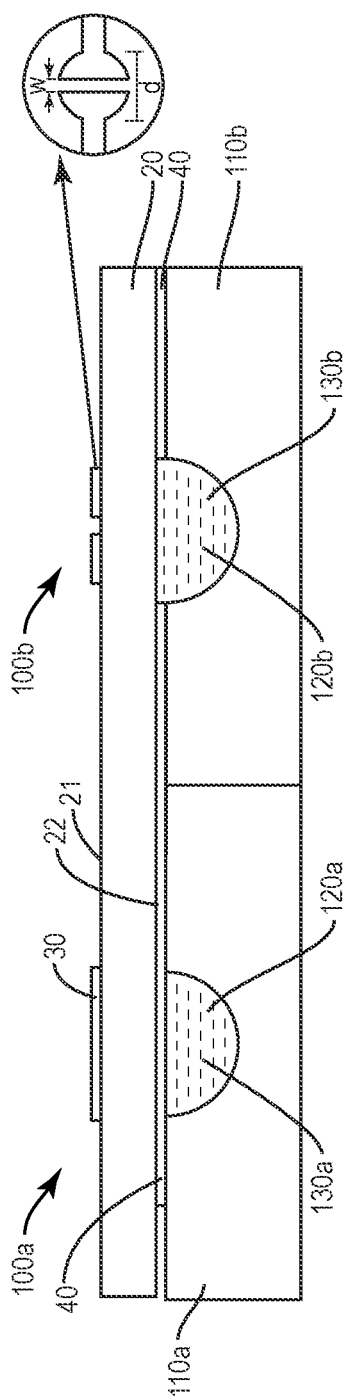
FIG. 50 is a side schematic view of a pair of acoustic wave devices integrated in a single unit.

FIG. 50 includes an example with transducers 100a, 100b integrated into a single piezoelectric crystal 20. The first device 100a is the same as described above for FIG. 49. The second device 100b is a transducer configured for lateral-field-excitation (LFE) XDCR sensing. The electrode 40 on the second surface 22 does not extend across the cavity 120b. In one example, the LFE transducers are mainly used in sensing. A functional layer may be applied to the piezoelectric layer 20 that is sensitive to the particles or specimens being detected.

Figure 51:
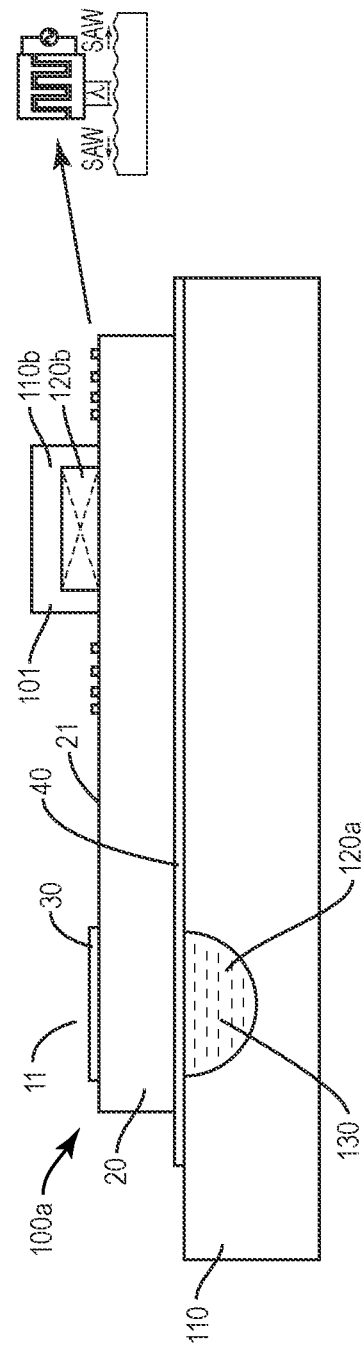
FIG. 51 is a side schematic view of a pair of acoustic wave devices integrated in a single unit.

FIG. 51 includes an example with first and second piezoelectric layers 20a, 20b mounted to a common substrate 110. In one example, the piezoelectric layer 20 is comprised of multiple sections. In one example as illustrated in FIG. 51, the piezoelectric layer 20 is single layer that supports both the wave types emitted by the devices 100a, 100b. The first device 100a includes electrodes 30, 40 on opposing surfaces 21, 22 of the piezoelectric crystal 20 with the active region 11 extending over a contoured cavity 120. The second device 100b includes a pair of surface acoustic wave (SAW) transducers that are mounted to the first surface 21 of the piezoelectric crystal 20. The device 100b also includes a mold 101 that contains the cavity 120 and is positioned between the SAW transducers. The two interdigital SAW transducers generate two counter-propagating waves that creates a standing wave pattern with displacement of the fluid 130 about pressure nodes and antinodes. In one example, the SAW transducers are oriented at an angle if that is the direction of optimum excitation.

In one example, the different devices 100 are illustrated as being positioned on different cavities 120. In another example, the devices 100 are positioned at different locations along a common cavity 120. The devices 100 can be spread apart and perform the same or different functions. In one example, one of the devices 100 emits an acoustic energy and a second device 100 senses the results in the fluid 130.

In one example with multiple devices 100 mounted on a piezoelectric material 20 (e.g., FIGS. 25, 25A, 26, 27), the devices 100 can be arbitrarily oriented to each other on the plane of the piezoelectric layer 20. In one specific example, a resonator 100a/transducer 100b combination mounted on a piezoelectric layer 20 can be oriented at different orientations to provide for transmitting and sensing signals. Additionally or alternatively, the cavities 120 on an integrated unit with multiple devices 100 can be arbitrarily oriented in the plane of the substrate 100. In one example such as illustrated in FIG. 27, one of the cavities 120 is arbitrarily implemented on the plane of the piezoelectric layer 20.

Figure 52:
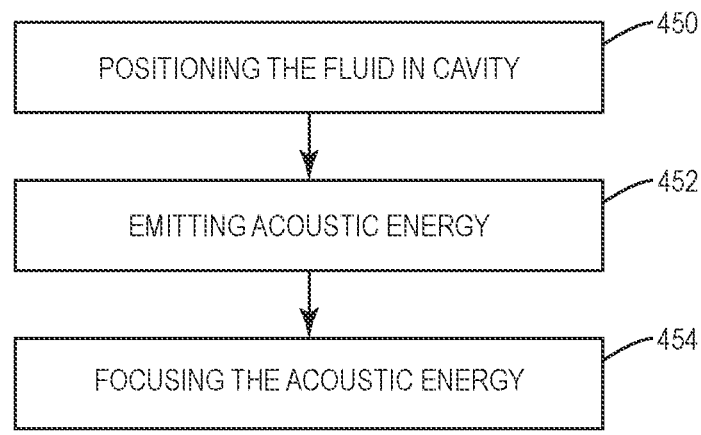
FIG. 52 is a flowchart diagram of a method of using an acoustic wave device to separate particles in a fluid.

FIG. 52 illustrates one method of using an acoustic wave device and separating particles in a fluid. The fluid 130 to be separated is positioned within a cavity 120 in a substrate 110 (block 450). The cavity 120 with the fluid 130 is positioned under the device 100. The device 100 emits acoustic energy from the active region 11 into the fluid 130 that is in the cavity 120 (block 452). The acoustic energy is focused within the cavity 120 (block 454).

In one example, the method can also include sensing the signal returned from the fluid 130. In one example, the sensing detects the particles within the fluid 130. The sensing can be performed by the same emitting device 100, or by a separate device 100 that is positioned on or in proximity to the cavity 120.

Figure 53:
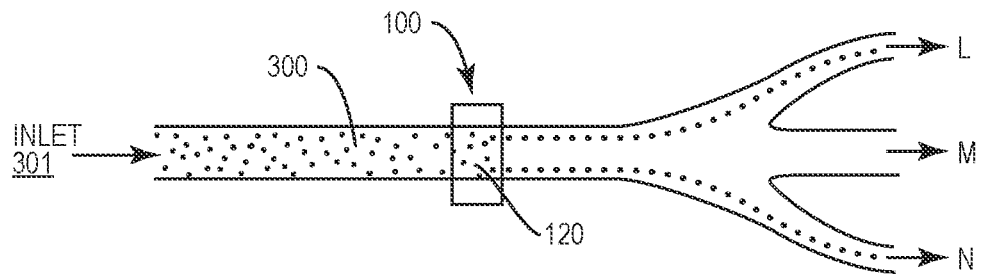
FIG. 53 is a schematic side view of an acoustic wave device used for separating blood cells from blood plasma.

FIG. 53 illustrates one example of a use for the device 100 for separating blood cells from blood plasma. The device 100 is positioned with the cavity 120 forming a section of a larger flow path 300 for the blood. The flow path 300 includes an inlet 301 where the blood is introduced. The blood flows along the flow path 300 and through the cavity 120 of the device 100. The device 100 emits acoustic energy that causes the blood cells to migrate towards the outer edges of the flow path 300. The separated blood is then moved to outlets L, M, N with the blood cells being directed to the outer outlets L and N, and the blood plasma directed to the central outlet M.

The system of FIG. 53 may also include a second device 100 (not illustrated) positioned downstream form the first device 100 (i.e., between the first device 100 and the outlets L, M, and N. The second device senses the particles in the blood after the application of the acoustic energy by the first device 100.

The resonators 10 can be used in a wide variety of contexts. Examples include but are not limited to transducers for emitting acoustic energy into a fluid 130, and sensors for detecting particles in a fluid 130. These functions can be performed by separate devices 100, or combined devices 100 that perform multiple different functions. The various devices 100 are able to control the aspects of the emitted acoustic energy, as well as the aspects of sensing the fluid 130.

The devices 100 can include a control unit 402 that controls the overall operation. The control unit 402 can be the same as that disclosed above in FIG. 41.

FIG. 31 illustrates an example in which the device 100 comprises a transducer with a contoured cavity 120 that holds the fluid 130. A cover 60 is mounted to the substrate and covers the cavity 120. The resonator 10 is mounted to an opposing side of the substrate 110 away from the cavity 120. The cavity 120 is further positioned with the concave side facing the resonator 10. In one example, this constructed is used with a cavity 120 having a hemispherical or hemi-ellipsoidal shape (e.g., see FIG. 23A). In another example, the cavity 120 has a cylindrical shape (e.g., see FIG. 24A).

Figure 54:
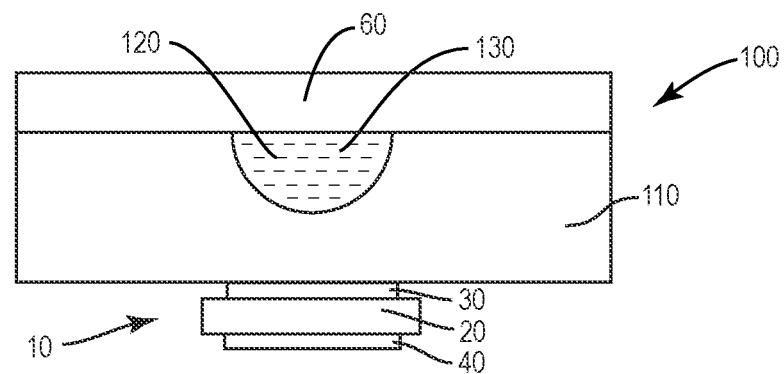
FIG. 54 is a side schematic view of an acoustic wave device.

In the example of FIG. 54, placing the resonator 10 on the bottom side of the substrate 110 provides for reverse contouring of the cavity 120. In this example, the emitted acoustic energy is focused by the curvature of the cavity 120. In one example (not illustrated), the resonator 10 includes an inactive region 12 with one or more transition regions 28 on the top or bottom surfaces 21, 22. In one example, the cover 60 is constructed from a softer material than the substrate 110 to reduce spurious reflection. In another example, one or both of the electrodes 30, 40 include arrays of distinct electrode elements that extend across the respective surface of the piezoelectric layer 20.

Another example of devices 100 are illustrated in FIGS. 55-58 and include array transducers with a piano-piano construction. The cavity 120 is formed in well 142 constructed from a softer material relative to the substrate 110.

Figure 55:
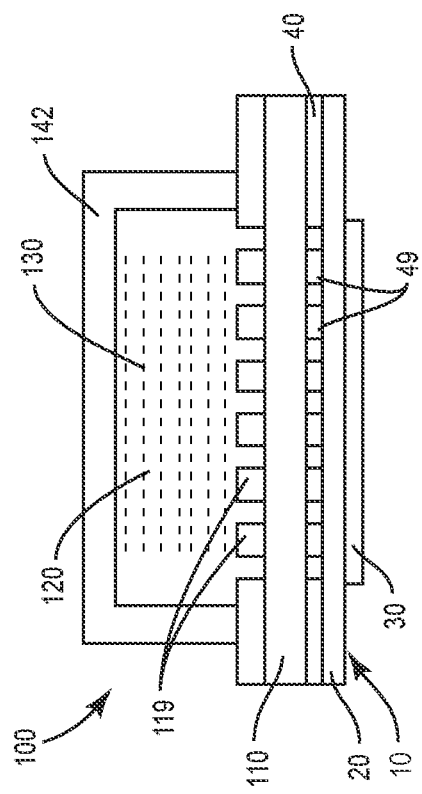
FIG. 55 is a side schematic view of an acoustic wave device.

FIG. 55 includes an electrode array 49 and substrate posts 119 positioned at the cavity 120 formed in a well 142. The well 142 is constructed from softer material than the substrate 110.

Figure 56:
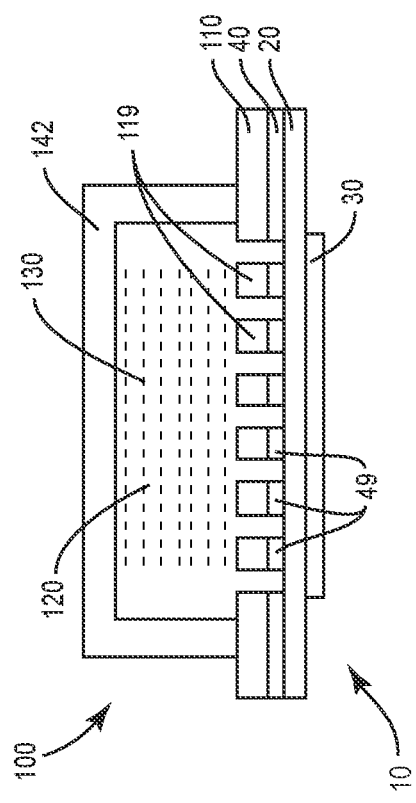
FIG. 56 is a side schematic view of an acoustic wave device.

FIG. 56 includes a similar design with the electrode 30 facing away from the cavity 120 including an electrode array 39. Electrode 40 is a single layer that extends across the piezoelectric crystal 20. Substrate posts 119 extend into the cavity 120 and contact against the fluid 130.

Figure 57:
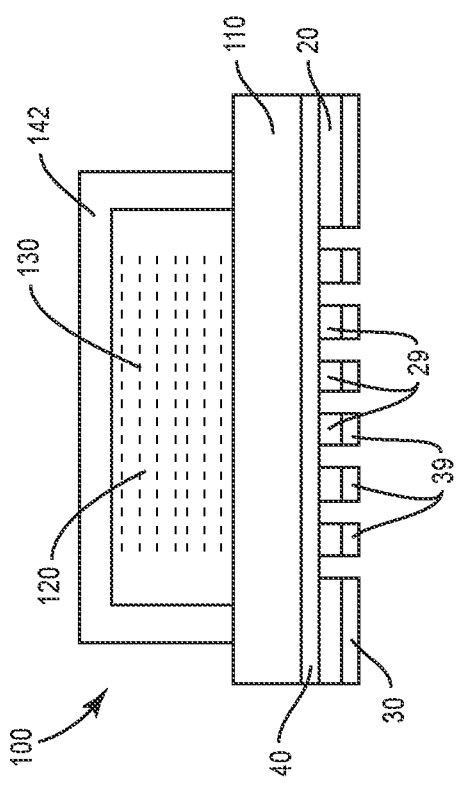
FIG. 57 is a side schematic view of an acoustic wave device.

FIG. 57 includes an electrode array 49 that is segregated from the fluid 130 by a substrate layer 110 and substrate posts 119.

Figure 58:
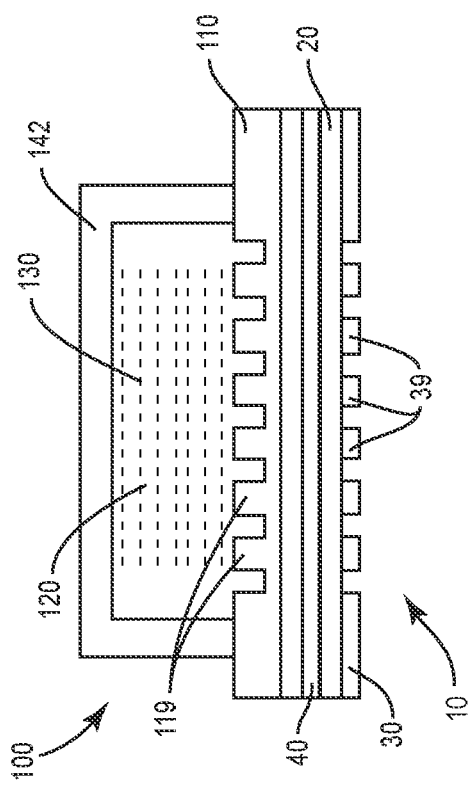
FIG. 58 is a side schematic view of an acoustic wave device.

FIG. 58 includes a piezoelectric array of individual elements mounted with an electrode array 39. The electrode 40 is a continuous layer that extends across and separates the substrate 110.

FIGS. 55-58 include resonators 10 with piano-piano configurations. In other examples, the resonators 10 include a contoured section 26 that is concave or convex (i.e., plano-concave, plano-convex). The contoured section 26 faces away from the cavity 120.

The piezoelectric crystal 20 can include a variety of different materials. Examples include but are not limited to lithium niobate, lithium tantalate, and quartz. The substrate 110 can include a variety of different materials. Examples include but are not limited to silicon, sapphire, and quartz. In another example, the substrate 110 is a softer material, such as polymethylsiloxane.

In one example with the resonator 10 isolated from the inactive region 12, the electrical connections to the electrodes 30, 40 in the resonator 10 can occur in various manners. In one example with the resonator 10 supported through one or more posts 119 as illustrated in FIG. 18A, the connections extend through the posts 119.

In one example, the various devices 100 are configured to detect one or more physical parameters that act on the device 100. Physical parameters include but are not limited to temperature, pressure, and shear stress.

In one example, the active region 11 is electrically isolated from the non-active region 12 by an isolation region. The isolation region can include one or more features that provide for the electrical isolation. The features include but are not limited to one or more notches that extend into one or both sides of the piezoelectric layer 20 with the notches forming one or more annular rings around the active region 11.

The piezoelectric crystal 20 can include a variety of different materials. Examples include but are not limited to lithium niobate, lithium tantalate, and quartz. The substrate 110 can include a variety of different materials. Examples include but are not limited to silicon, sapphire, and quartz. In another example, the substrate 110 is a softer material, such as polymethylsiloxane.

The notches that can form the transition region 28 form a moat-like structure that extends around and isolates the central active region 11. The notches can include a variety of different sectional shapes and sizes. Examples include but are not limited to vertical walls, trapezoidal, ellipsoidal, and hemispherical. In one example, vertical walls are formed by an ion-milling process. Non-vertical walls are formed by chemical or reactive ion etching (RIE).

The transition region 28 that isolate the active region 11 of the resonator 10 can include various constructions. One example disclosed above include notches that are formed in the piezoelectric crystal 20. In another example, the active region 11 can be spaced away from the inactive region 12. FIGS. 21, 22, 30, 31, 36 and 37 include examples in which one of the electrodes 30, 40 are spaced away from the inactive region 12. In these specific examples, the first electrode 30 is relatively small (i.e., short in length). This small size creates an area in the piezoelectric crystal 20 that is not overlapped on both sides by the electrodes 30, 40 and thus provides for electrically isolating the active region 11. The length of this region can vary depending upon the size and positioning of one or both electrodes 30, 40.

In one example with the resonator 10 isolated from the inactive region 12, the electrical connections to the electrodes 30, 40 in the resonator 10 can occur in various manners. In one example with the resonator 10 supported through one or more posts 119 as illustrated in FIG. 18A, the connections extend through the posts 119. In one example with the resonator 10 isolated by isolation region formed by an annular trough formed by one or more notches and supported by one or more tethers such as illustrated in FIGS. 23, 24, and 25, the electrical connections extend through the one or more tethers.

In one example, the various devices 100 are configured to detect one or more physical parameters that act on the device 100. Physical parameters include but are not limited to temperature, pressure, and shear stress.

In one example, the active region 11 is electrically isolated from the non-active region 12 by an isolation region. The isolation region can include one or more features that provide for the electrical isolation. The features include but are not limited to one or more notches that extend into one or both sides of the piezoelectric layer 20 with the notches forming one or more annular rings around the active region 11.

In one example, the electrical connections that provide for the electrodes 30, 40 with opposite polarity can be through one or more of the posts, tethers, and substrate.

PCT Application No. PCT/US2021/040427 titled "Acoustic Wave Devices for Microfluidic Applications" and PCT Application No. PCT/US2021/040441 titled "Dual Thickness-Shear Mode Resonator Structures for Frequency Control and Sensing" are each being filed on the same day as the present application. These PCT applications disclose various examples of resonators, sensors, and context of use for the resonators and sensors and are each hereby incorporated by reference in their entirety.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The present invention may be carried out in other specific ways than those herein set forth without departing from the scope and essential characteristics of the invention. The present embodiments are, therefore, to be considered in all respects as illustrative and not restrictive.

What is claimed is:

1. A sensor comprising:
    a resonator comprising:
        a piezoelectric layer comprising opposing first and second sides, the first side comprising a contoured section;
        a first electrode positioned on the first side of the piezoelectric layer;
        a second electrode positioned on the opposing second side of the piezoelectric layer;
    a plate that extends across the resonator at the first side.

2. The sensor of claim 1, further comprising a post that extends outward from the piezoelectric layer at the contoured section.

3. The sensor of claim 2, wherein the piezoelectric layer and the post are constructed from a single piezoelectric material.

4. The sensor of claim 2, wherein the plate comprises at least one floating element that is positioned in an overlapping arrangement with the contoured section, the at least one floating element being supported by the post.

5. The sensor of claim 4, further comprising voids that extend through the plate to isolate the at least one floating element from a remainder of the plate.

6. The sensor of claim 2, further comprising a metalized layer positioned on an end of the post that is opposite from the piezoelectric layer, the metalized layer contacting against the plate.

7. The sensor of claim 1, wherein the resonator comprises an active area at the contoured section and an inactive area along a periphery of the active area, the piezoelectric layer comprising a smaller thickness at the active area than at a maximum thickness of the inactive area.

8. The sensor of claim 7, wherein the plate is supported by the first electrode at the inactive area and by the post at the active area.

9. The sensor of claim 1, wherein the contoured section is a first contoured section and further comprising the second side of the piezoelectric layer comprising a second contoured section with the first contoured section and the second contoured section being in an overlapping arrangement.

10. The sensor of claim 1, wherein at least one of the first electrode and the second electrode comprise arrays of discrete electrode members that are spaced apart across the piezoelectric layer.

11. A sensor comprising:
a piezoelectric crystal comprising a contoured first side and an opposing second side, the contoured first side comprising a contoured section;
a first electrode that extends along the contoured first side of the piezoelectric crystal, the first electrode comprising a contoured section;
a second electrode that extends along the second side of the piezoelectric crystal;
an active region comprising the overlapping contoured section of the piezoelectric crystal, the contoured section of the first electrode, and a section of the second electrode that overlaps the contoured section of the first electrode;
an inactive region that surrounds the active region; and
a plate that extends over the active region.

12. The sensor of claim 11, wherein the inactive region is formed by the piezoelectric crystal, the first electrode, and the second electrode.

13. The sensor of claim 11, wherein the contoured first side of the piezoelectric crystal and the first electrode comprise one of a concave shape and a convex shape with the concave shape extending inward towards a longitudinal centerline of the piezoelectric crystal and the convex shape extending outward away from the longitudinal centerline.

14. The sensor of claim 11, further comprising each of the second side of the piezoelectric crystal and the second electrode comprising one of a concave shape and a convex shape.

15. The sensor of claim 11, further comprising a post that extends from the contoured section of the piezoelectric crystal with the plate supported at the active region by the post and along a peripheral section by the inactive region.

16. The sensor of claim 15, further comprising the post and the piezoelectric crystal constructed from a single piezoelectric material.

17. The sensor of claim 11, wherein at least one of the first electrode and the second electrode comprise arrays that include a plurality of discrete electrode elements that are spaced apart and connected to the piezoelectric crystal.

18. A sensor comprising:
a resonator comprising:
a piezoelectric crystal comprising a contoured first side and an opposing second side, the contoured first side comprising a contoured section;
a first electrode that extends along the first side of the piezoelectric crystal, the first electrode comprising a contoured section at the contoured section of the piezoelectric crystal;
a second electrode that extends along the second side of the piezoelectric crystal;
an active region comprising the contoured section of the piezoelectric crystal, the contoured section of the first electrode, and a section of the second electrode that overlaps the contoured section of the first electrode;
an inactive region that surrounds the active region and that comprises the piezoelectric crystal; and
wherein a thickness of the piezoelectric crystal in the active region is equal to a maximum thickness of the piezoelectric crystal in the inactive region.

19. The sensor of claim 18, further comprising:
a plate that is contoured and that extends over the active region and is supported by the inactive region that surrounds the active region; and
a post that extends outward from the plate and contacts the active region along a centerline of the resonator.

20. The sensor of claim 18, wherein at least one of the first electrode and the second electrode comprise arrays with a plurality of discrete electrode elements that are spaced apart and connected to the piezoelectric crystal.

* * * * *